United States Patent [19]
Iiboshi

[11] Patent Number: 6,157,063
[45] Date of Patent: Dec. 5, 2000

[54] MOS FIELD EFFECT TRANSISTOR WITH AN IMPROVED LIGHTLY DOPED DIFFUSION LAYER STRUCTURE AND METHOD OF FORMING THE SAME

[75] Inventor: Naoki Iiboshi, Kumamoto, Japan

[73] Assignee: NEC Corporation, Tokyo, Japan

[21] Appl. No.: 09/121,897

[22] Filed: Jul. 24, 1998

[30] Foreign Application Priority Data

Jul. 25, 1997 [JP] Japan ................................ 9-200140

[51] Int. Cl.[7] .................................................. H01L 29/76
[52] U.S. Cl. .......................................... 257/344; 257/408
[58] Field of Search .................................. 257/408, 344, 257/384, 900

[56] References Cited

U.S. PATENT DOCUMENTS

| | | | |
|---|---|---|---|
| 5,319,232 | 6/1994 | Pfiester | 257/408 |
| 5,422,506 | 6/1995 | Zamapian | 257/408 |
| 5,472,896 | 12/1995 | Chen et al. | 467/44 |
| 5,521,411 | 5/1996 | Chen et al. | 257/344 |
| 5,726,479 | 3/1998 | Matsumoto et al. | 257/344 |
| 5,747,852 | 5/1998 | Chang et al. | 257/344 |
| 5,780,896 | 7/1998 | Ono | 257/408 |
| 5,847,428 | 12/1998 | Fulford, Jr. et al. | 257/408 |
| 5,900,666 | 5/1999 | Gardner et al. | 257/408 |

FOREIGN PATENT DOCUMENTS

| | | |
|---|---|---|
| 1-291464 | 11/1989 | Japan . |
| 3-155641 | 7/1991 | Japan . |
| 7-307470 | 11/1995 | Japan . |

*Primary Examiner*—Mark V. Prenty
*Attorney, Agent, or Firm*—Young & Thompson

[57] ABSTRACT

A lightly-doped diffusion layer structure is formed under a side wall insulator on a side wall of a gate electrode of a MOS field effect transistor, wherein a side wall spacer layer is provided on an interface between the side wall of the gate electrode and the side wall insulator, and an inside edge of the lightly-doped diffusion layer is positioned under the side wall spacer layer so that the inside edge of the lightly-doped diffusion layer is positioned inside of the side wall insulator and outside of the gate electrode.

9 Claims, 38 Drawing Sheets

MOS FIELD EFFECT TRANSISTOR WITH AN IMPROVED LIGHTLY DOPED DIFFUSION LAYER STRUCTURE AND METHOD OF FORMING THE SAME

BACKGROUND OF THE INVENTION

The present invention relates to a MOS field effect transistor with an improved lightly doped diffusion layer structure and more particularly to a MOS field effect transistor having refractory metal silicide layers on a gate, and source and drain layers as well as a method of forming the same.

The requirements for scaling down the semiconductor devices and increase in density of integration of the semiconductor devices have been on the increase. At present, 0.25 micrometers scale rule has been applied to design the advanced semiconductor devices such as logic devices.

The scaling down of the semiconductor device is most effective to realize a further increase in density of integration of the semiconductor device and an improvement in high speed performances thereof, for which reason how to scale down the semiconductor device as much as possible an essential issue to be realized. In order to realize a substantive scale down of the semiconductor devices, it is required to form shallow diffusion layers as source and drain regions in the MOS field effect transistor. However, the shallow diffusion layers results in a high resistance of the source and drain regions. The increase in resistance of the source and drain regions results in a remarkable drop of a current driving ability of the MOS field effect transistor. This makes it difficult to improve high speed performances of the MOS field effect transistor. Accordingly, there exist serious problems with an increased resistance of the source and drain regions due to the formation of the shallow source and drain regions for scaling down of the MOS field effect transistors.

In order to solve the above problems, it has been proposed to form metal silicide layers on the gate, and the source and drain regions, wherein the metal silicide layers have a lower resistivity. Namely, a proposal was made for forming the MOS field effect transistor with the silicide structure or a self-aligned silicide structure often referred to as a salicide structure.

The silicide structure, however, raises another problem with likelihood of formation of short circuit between source/drain diffusion layers and the gate of the MOS field effect transistor.

In Japanese laid-open patent publication No. 8-204188, it is disclosed to attempt settlement of the above other problem with the short circuit. A conventional fabrication method of the MOS field effect transistor will be described with reference to FIGS. 1A through 1C.

With reference to FIG. 1A, a p-type silicon substrate 21 is used. Field oxide films 22 are selectively formed on a surface of the p-type silicon substrate 21 to define an active region on which a MOS field effect transistor will be formed. A gate oxide film 23 is formed on an active region of the p-type silicon substrate 21. A polysilicon gate electrode 24 is formed on the gate oxide film 23. The polysilicon gate electrode 24 and the field oxide films 22 are used as masks for ion-implantation of an n-type impurity into the surface region of the p-type silicon substrate 21 and subsequent heat treatment to the p-type silicon substrate 21 for causing a thermal diffusion of ion-implanted n-type impurity, whereby shallow lightly-doped diffusion regions 25 are formed in upper regions of the p-type silicon substrate 21 except under the gate electrode 24 and under the field oxide films 22. A chemical vapor deposition is carried out to entirely deposit a silicon oxide film 26 having a thickness of about 50 nanometers so that the silicon oxide film 26 covers the field oxide films 22 and the lightly doped diffusion regions 25 as well as side walls and a top surface of the polysilicon gate electrode 24. Further, a silicon nitride film 27 having a thickness of about 70 nanometers is then formed on the silicon oxide film 26 thereby forming laminations of the silicon oxide film 26 and the silicon nitride film 27.

With reference to FIG. 1B, a reactive ion etching is carried out to the laminations of the silicon oxide film 26 and the silicon nitride film 27 so that the silicon oxide film 26 and the silicon nitride film 27 are subjected to the etch-back whereby the laminations of the silicon oxide film 26 and the silicon nitride film 27 remain only on the side walls of the polysilicon gate electrode 24. As a result, the laminations of the silicon oxide film 26 and the silicon nitride film 27 are made into laminations of a side wall silicon oxide film 28 and a side wall silicon nitride film 29 which are provided on the side walls of the polysilicon gate electrode 24. An ion-implantation of an n-type impurity into the silicon substrate 1 is carried out by use of the side wall silicon oxide films 28 and the side wall silicon nitride films 29 as masks for subsequent heat treatment thereby to form source/drain diffusion layers 30.

With reference to FIG. 1C, a titanium film having a thickness of about 50 nanometers is entirely deposited which extends on the field oxide films and over the source/drain diffusion layers 30 as well as on the side wall silicon nitride films 29 and over the side wall silicon oxide films 28 and a top surface of the polysilicon gate electrode 24. A heat treatment to the silicon substrate 1 in an inert gas such as a nitrogen gas to cause a silicidation reaction between silicon and titanium atoms whereby titanium silicide layers 31 are selectively formed on the top surface of the polysilicon gate electrode 24 and on the source/drain diffusion layers 30, whilst no silicidation reaction is caused over the field oxide films 22 and on the side wall silicon nitride films 29 and the side wall silicon oxide films 28. The unreacted titanium film is removed.

The source/drain diffusion layers 30 have the silicide structure and the lightly-doped diffusion structure. The polysilicon gate electrode 24 also has the silicide structure.

The above conventional MOS field effect transistor, however, has the following four problems.

The first problem is concerned with an overlap of the lightly-doped diffusion layer 25 and the polysilicon gate electrode 24 as illustrated in FIG. 2. Namely, the lightly-doped diffusion layers 25 are formed by ion-implantation of the impurity by use of the polysilicon gate electrode 24 as the mask whereby the inside edges of the lightly doped diffusion layers 25 are positioned under the outside edge of the polysilicon gate electrode 24. Thereafter, to form the source and drain diffusion layers 30, the heat treatment is caused. This heat treatment, however, causes further diffusions inwardly of the lightly doped diffusion layers 25, whereby the inside edges of the lightly doped diffusion layers are moved into inside of the outside edges of the polysilicon gate electrode 24. As a result, the inside end portions of the lightly doped diffusion layers 25 are positioned under the polysilicon gate electrode 24, for which reason there are formed overlaps between the lightly doped diffusion layers 25 and the polysilicon gate electrode 24. Particularly if the 0.25 micrometers scale rule is applied to design of the MOS field effect transistor, the overlap between the lightly doped diffusion layers 25 and the polysilicon gate electrode 24 is not ignorable. This further makes it difficult to control a channel length of the conventional MOS field effect transistor.

The second problem is concerned with a difficulty in control of etch-back to form the side wall silicon oxide films 28 and the side wall silicon nitride films 29. Namely, the above conventional MOS field effect transistor has a multi-layered or double-layered side wall insulator structure comprising laminations of the silicon oxide film 28 and the silicon nitride film 29. The multi-layered or double-layered side wall insulator structure makes it difficult to do a precise control of the etch-back due to different materials of the double layers. This problem is more remarkable if the MOS field effect transistor is scaled down.

The third problem is concerned with an increase in parasitic capacitance between the polysilicon gate electrode 24 and the source/drain diffusion layers 30. Namely, the side wall insulation layers 28 and 29 as dielectric films are formed on the side walls of the polysilicon gate electrode 24. Particularly, the silicon nitride films 29 have a high dielectric constant. For those reasons, the formations of the side wall insulation layers 28 and 29 on the side walls of the polysilicon gate electrode 24 result in increase in fringe capacitance or parasitic capacitance.

The fourth problem is concerned with an insulating resistance between the adjacent two polysilicon gate electrodes 24. The polysilicon gate electrodes 24 are defined by a dry etching to a polysilicon layer extending over the gate insulation film and also over the field oxide films 22. There are steps with a difference in level at boundaries between the gate insulation film 23 and the field oxide films 22. In the dry etching process, the polysilicon layer is likely to reside on the steps between the gate insulation film 23 and the field oxide films 22. The residual polysilicon films on the steps between the gate insulation film 23 and the field oxide films 22 may cause a slight leakage of current between the adjacent two polysilicon gate electrodes. The likelihood of causing the slight leakage of current between the adjacent two polysilicon gate electrodes is increased if the MOS field effect transistors are scaled down and the density of integration of the MOS field effect transistors is increased.

In the above circumstances, it had been required to develop a novel MOS field effect transistor with a side wall insulation structure free from the above first to fourth problems.

SUMMARY OF THE INVENTION

Accordingly, it is an object of the present invention to provide a novel MOS field effect transistor with a side wall insulation structure and a metal silicide structure free from the above problems.

It is a further object of the present invention to provide a novel MOS field effect transistor with a side wall insulation structure and a metal silicide structure to allow a further substantive or remarkable scale down thereof.

It is a still further object of the present invention to provide a novel MOS field effect transistor with a side wall insulation structure and a metal silicide structure to allow the novel MOS field effect transistor to exhibit improved high performance.

It is yet a further object of the present invention to provide a novel MOS field effect transistor with a side wall insulation structure and a metal silicide structure, which is free of any substantive overlap between lightly doped diffusion layers and a gate electrode.

It is a further more object of the present invention to provide a novel MOS field effect transistor with a side wall insulation structure and a metal silicide structure, which makes it easy to do a precise control of a channel length thereof.

It is still more object of the present invention to provide a novel MOS field effect transistor with a side wall insulation structure and a metal silicide structure, which makes it easy to an accurate control to etch-back by a reactive ion etching in forming side wall insulation films.

It is moreover object of the present invention to provide a novel MOS field effect transistor with a side wall insulation structure and a metal silicide structure, which allows a remarkable reduction of a parasitic capacitance between a gate electrode and source/drain diffusion layers.

It is another object of the present invention to provide a novel MOS field effect transistor with a side wall insulation structure and a metal silicide structure, which has an increased resistivity to hot-electron.

It is still another object of the present invention to provide a novel MOS field effect transistor with a side wall insulation structure and a metal silicide structure, which is free from a problem with a leakage of current between the adjacent two gate electrodes.

It is yet another object of the present invention to provide a novel method of forming a MOS field effect transistor with a side wall insulation structure and a metal silicide structure free from the above problems.

It is further another object of the present invention to provide a novel method of forming a MOS field effect transistor with a side wall insulation structure and a metal silicide structure to allow a further substantive or remarkable scale down thereof.

It is an additional object of the present invention to provide a novel method of forming a MOS field effect transistor with a side wall insulation structure and a metal silicide structure to allow the novel MOS field effect transistor to exhibit improved high performance.

It is a still additional object of the present invention to provide a novel method of forming a MOS field effect transistor with a side wall insulation structure and a metal silicide structure, which is free of any substantive overlap between lightly doped diffusion layers and a gate electrode.

It is yet an additional object of the present invention to provide a novel method of forming a MOS field effect transistor with a side wall insulation structure and a metal silicide structure, which makes it easy to do a precise control of a channel length thereof.

It is a further additional object of the present invention to provide a novel method of forming a MOS field effect transistor with a side wall insulation structure and a metal silicide structure, which makes it easy to an accurate control to etch-back by a reactive ion etching in forming side wall insulation films.

It is also additional object of the present invention to provide a novel method of forming a MOS field effect transistor with a side wall insulation structure and a metal silicide structure, which allows a remarkable reduction of a parasitic capacitance between a gate electrode and source/drain diffusion layer.

It is also additional object of the present invention to provide a novel method of forming a MOS field effect transistor with a side wall insulation structure and a metal silicide structure, which has an increased resistivity to hot-electron.

It is also additional object of the present invention to provide a novel method of forming a MOS field effect transistor with a side wall insulation structure and a metal silicide structure, which is free from a problem with a leakage of current between the adjacent two gate electrodes.

The present invention provides a lightly-doped diffusion layer structure formed under a side wall insulator on a side wall of a gate electrode of a MOS field effect transistor, wherein a side wall spacer layer is provided on an interface between the side wall of the gate electrode and the side wall insulator, and an inside edge of the lightly-doped diffusion layer is positioned under the side wall spacer layer so that the inside edge of the lightly-doped diffusion layer is positioned inside of the side wall insulator and outside of the gate electrode.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

The other present invention provides a method of forming a lightly-doped diffusion layer structure under a side wall insulator on a side wall of a gate electrode of a MOS field effect transistor. The method comprising the following steps. Side wall spacer layers are provided which extend at least on side walls of the gate electrode. A first ion-implantation is carried out by use of the gate electrode and the side wall spacer layers as masks to selectively form lightly-doped diffusion layers in a semiconductor substrate, so that inside edges of the lightly-doped diffusion layers are positioned under outside edges of the side wall spacer layers. Side wall insulation films are selectively formed on the side wall spacer layers. A second ion-implantation is carried out by use of the gate electrode, the side wall spacer layers and the side wall insulation films as masks to selectively form source/drain diffusion layers in the semiconductor substrate. The semiconductor substrate is subjected to a heat treatment to cause an activation of ions implanted by the second ion-implantation whereby ions implanted by the first ion-implantation are thermally diffused, thereby to allow the inside edges of the lightly-doped diffusion layers are inwardly diffused to a position under the side wall spacer layer so that the inside edge of the lightly-doped diffusion layer is positioned inside of the side wall insulator and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
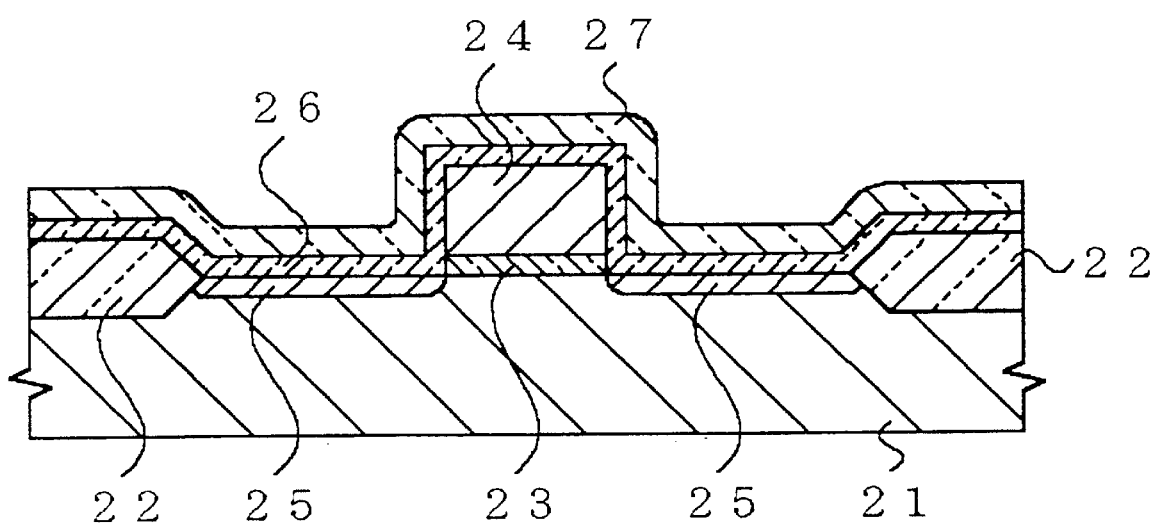
FIGS. 1A through 1C are fragmentary cross sectional elevation views illustrative of MOS field effect transistors in sequential steps involved in the conventional fabrication method.
Figure 1B:
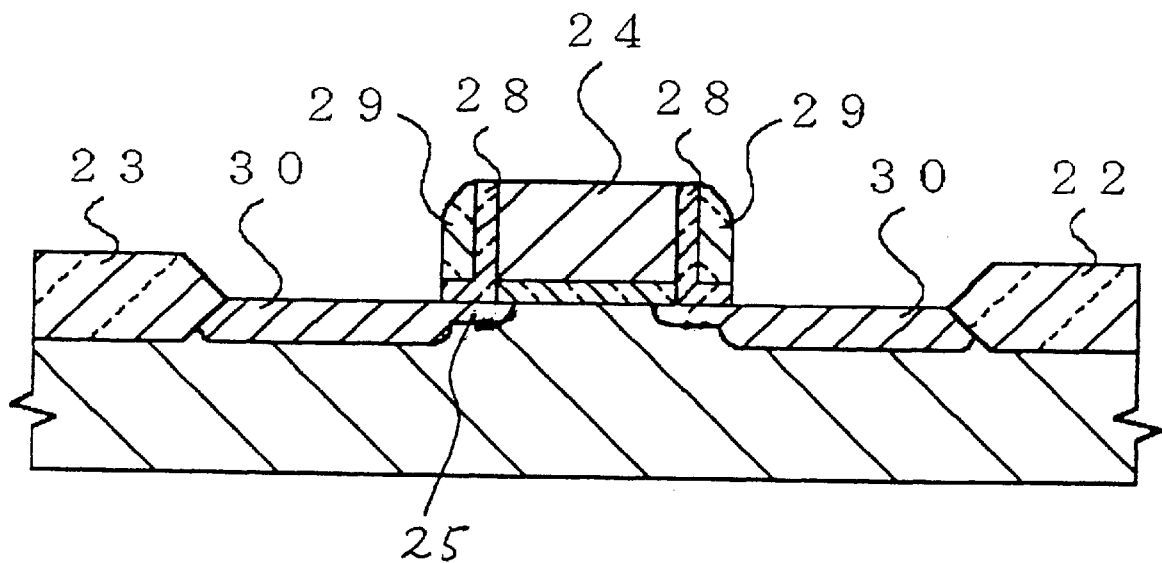
Figure 1C:
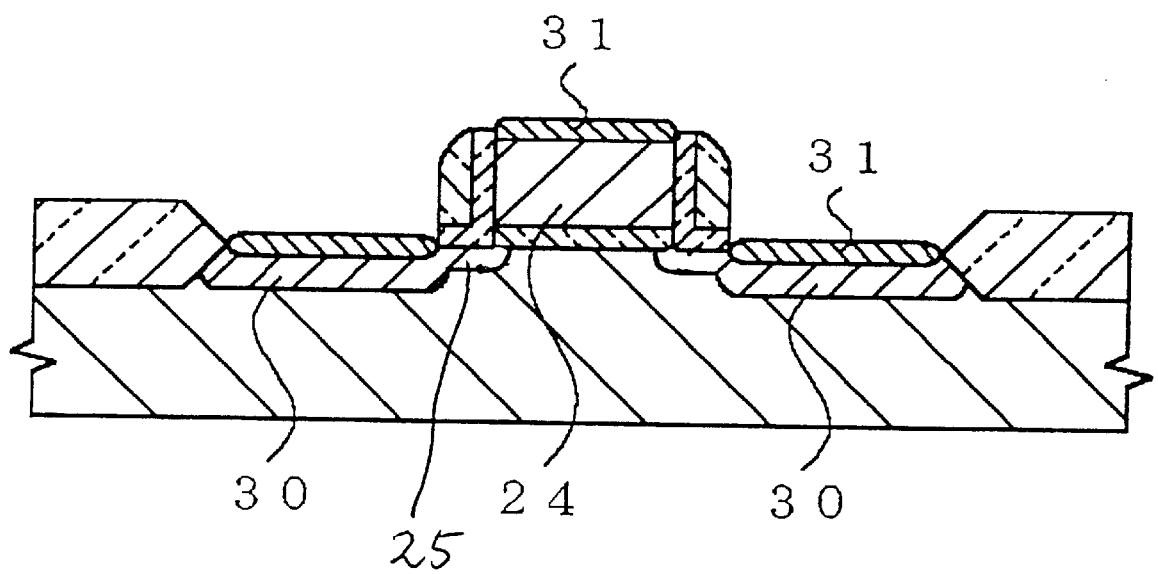
Figure 2:
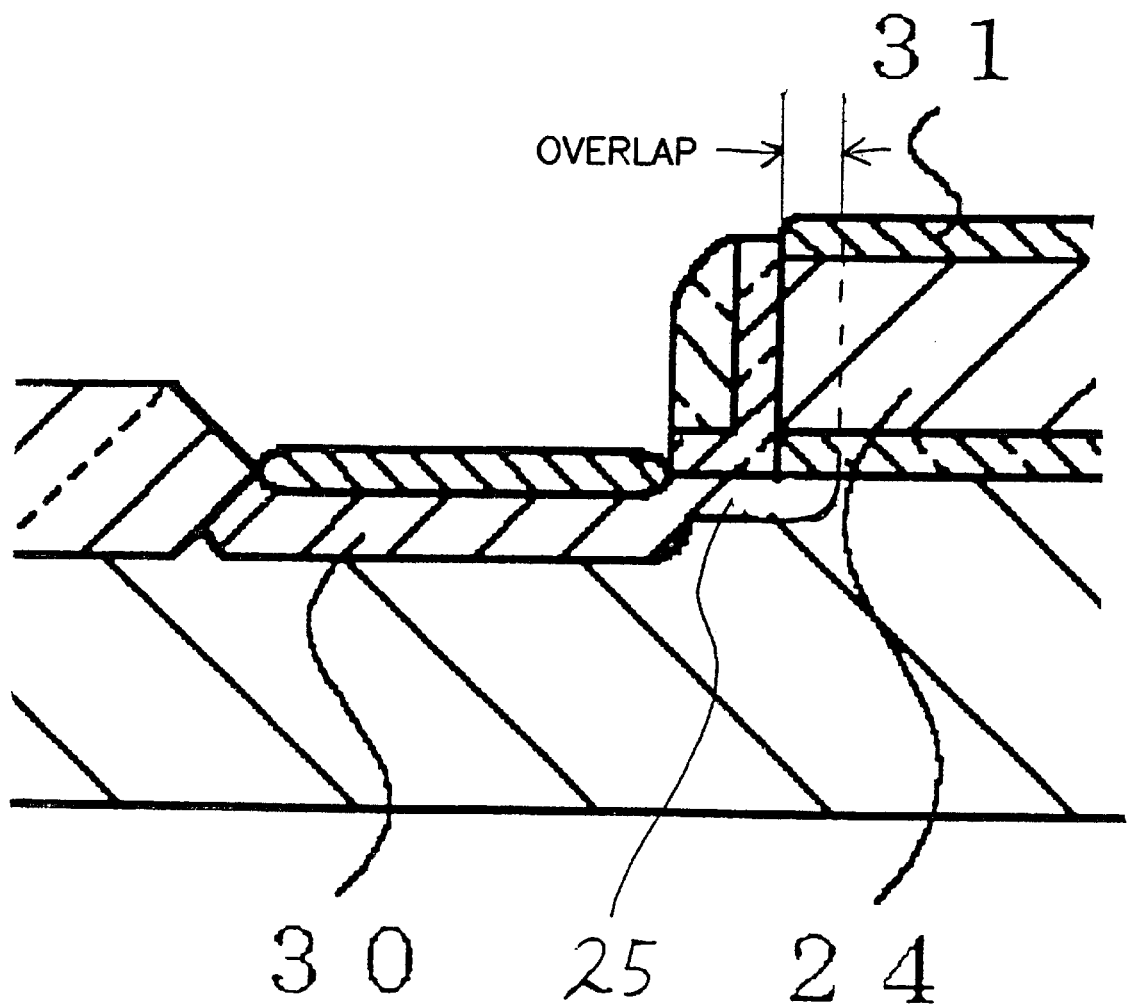
FIG. 2 is a fragmentary enlarged cross sectional elevation view illustrative of an overlap between a lightly doped diffusion layer and a polysilicon gate electrode in the conventional MOS field effect transistor.
Figure 3:
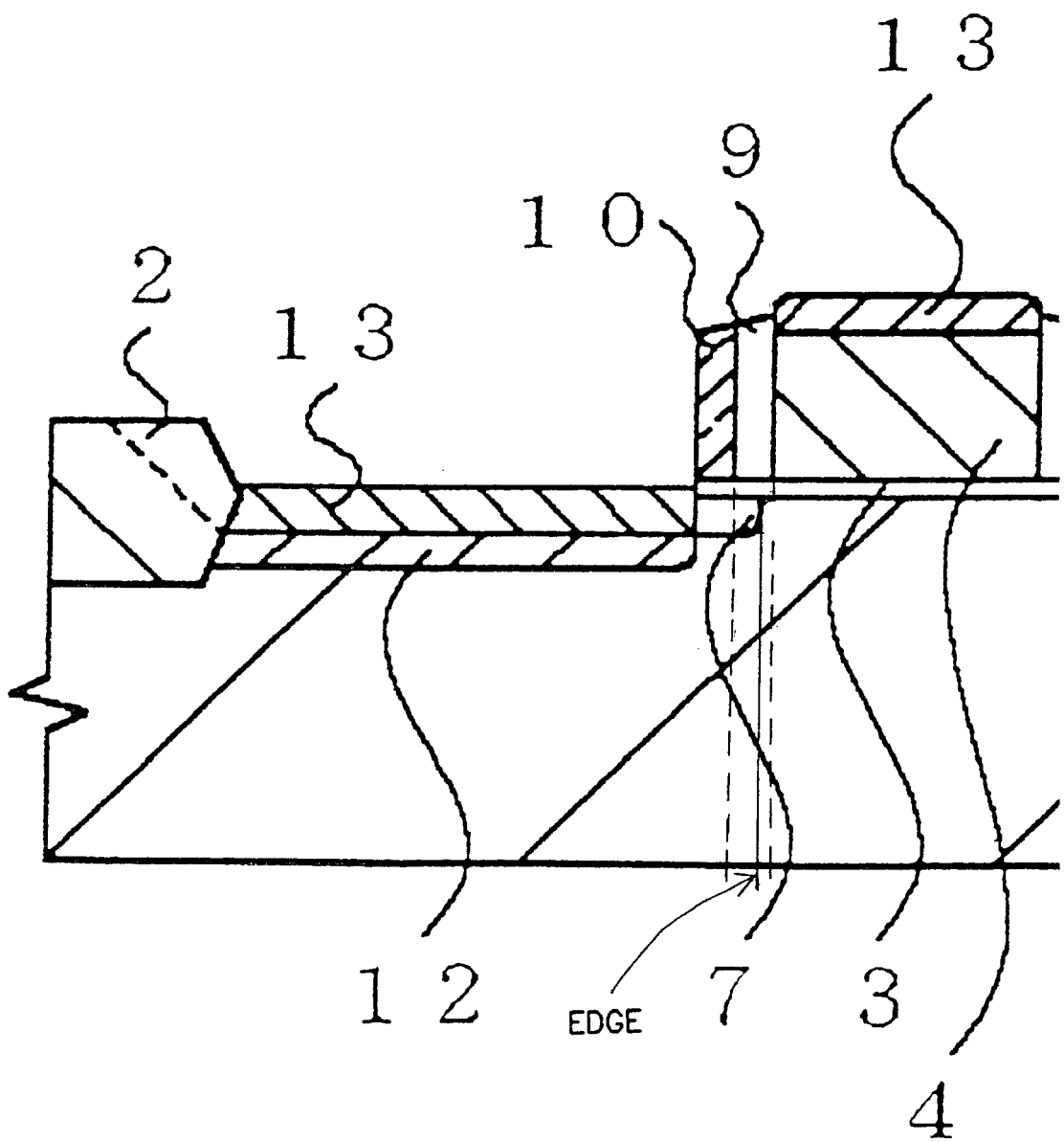
FIG. 3 is a fragmentary enlarged cross sectional elevation view illustrative of a novel lightly-doped diffusion layer structure of a MOS field effect transistor in accordance with the first to sixth present inventions.

The first present invention provides a lightly-doped diffusion layer structure formed under a side wall insulator on a side wall of a gate electrode of a MOS field effect transistor, wherein a side wall spacer layer is provided on an interface between the side wall of the gate electrode and the side wall insulator, and an inside edge of the lightly-doped diffusion layer is positioned under the side wall spacer layer so that the inside edge of the lightly-doped diffusion layer is positioned inside of the side wall insulator and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

It is preferable that the inside edge of the lightly-doped diffusion layer is positioned under an interface between the gate electrode and the side wall spacer layer.

It is also preferable that the inside edge of the lightly-doped diffusion layer is positioned under an interface between the side wall spacer layer and the side wall insulator.

It is also preferable that the inside edge of the lightly-doped diffusion layer is positioned under an intermediate position in a thickness direction of the side wall spacer layer.

It is also preferable that the side wall spacer layer has a thickness in the range of 5–10 nanometers.

It is also preferable that the side wall spacer layer is made of silicon oxide.

It is also preferable that the side wall spacer layer is made of silicon nitride.

It is also preferable that the gate electrode comprises a polysilicon layer on which a metal silicide layer is formed.

It is also preferable that metal silicide layers are further provided on source and drain diffusion layers. The metal silicide layers reduce the resistances of the source and drain diffusion layers even if the source and drain diffusion layers are extremely shallow. This allows the MOS field effect transistor both to exhibit high frequency and high speed performance and to be scaled down for increase in density of integration thereof.

It is also preferable that the side wall insulator is made of one selected from the group consisting of silicon oxide and silicon nitride.

If the side wall insulator and the side wall spacer layer are made of silicon oxide, this makes it easy to do an accurate control of etch-back to form the side wall silicon oxide films and the side wall silicon oxide spacer layers. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode and the source/drain diffusion layers.

The second present invention provides a side wall structure on a side wall of a gate electrode of a MOS field effect transistor, wherein a side wall spacer layer is provided on an interface between the side wall of the gate electrode and a side wall insulator, and an inside edge of the lightly-doped diffusion layer is positioned under the side wall spacer layer so that the inside edge of the lightly-doped diffusion layer is positioned inside of the side wall insulator and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

It is preferable that the inside edge of the lightly-doped diffusion layer is positioned under an interface between the gate electrode and the side wall spacer layer.

It is also preferable that the inside edge of the lightly-doped diffusion layer is positioned under an interface between the side wall spacer layer and the side wall insulator.

It is also preferable that the inside edge of the lightly-doped diffusion layer is positioned under an intermediate position in a thickness direction of the side wall spacer layer.

It is also preferable that the side wall spacer layer has a thickness in the range of 5–10 nanometers.

It is also preferable that the side wall spacer layer is made of silicon oxide.

It is also preferable that the side wall spacer layer is made of silicon nitride.

It is also preferable that the gate electrode comprises a polysilicon layer on which a metal silicide layer is formed.

It is also preferable that metal silicide layers are further provided on source and drain diffusion layers. The metal silicide layers reduce the resistances of the source and drain diffusion layers even if the source and drain diffusion layers are extremely shallow. This allows the MOS field effect transistor both to exhibit high frequency and high speed performance and to be scaled down for increase in density of integration thereof.

It is also preferable that the side wall insulator is made of one selected from the group consisting of silicon oxide and silicon nitride.

If the side wall insulator and the side wall spacer layer are made of silicon oxide, this makes it easy to do an accurate control of etch-back to form the side wall silicon oxide films and the side wall silicon oxide spacer layers. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode and the source/drain diffusion layers.

The third present invention provides a MOS field effect transistor comprising the following elements. Source/drain diffusion layers having upper regions which comprise metal silicide layers are selectively provided in upper regions of a silicon substrate. Lightly-doped diffusion layers extend from inside edges of the source/drain diffusion layers toward a channel region of the silicon substrate. A gate insulation film is provided on the channel region of the silicon substrate. A gate electrode is provided on the gate insulation film. Side wall insulation films are provided on side walls of the gate electrode so that outside edges of the side wall insulation films are positioned over boundaries between the source/drain diffusion layers and the lightly-doped diffusion layers. Side wall spacer layers are further provided on interfaces between the side walls of the gate electrode and the side wall insulation films, and inside edges of the lightly-doped diffusion layers are positioned under the side wall spacer layers so that each of the inside edges of the lightly-doped diffusion layers is positioned inside of the side wall insulation films and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

The metal silicide layers reduce the resistances of the source and drain diffusion layers even if the source and drain diffusion layers are extremely shallow. This allows the MOS field effect transistor both to exhibit high frequency and high sped performances and to be scaled down for increase in density of integration thereof.

It is preferable that rein the inside edge of the lightly-doped diffusion layer is positioned under an interface between the gate electrode and the side wall spacer layer.

It is also preferable that the inside edge of the lightly-doped diffusion layer is positioned under an interface between the side wall spacer layer and the side wall insulation film It is also preferable that the inside edge of the lightly-doped diffusion layer is positioned under an intermediate position in a thickness direction of the side wall spacer layer.

It is also preferable that the side wall spacer layer has a thickness in the range of 5–10 nanometers.

It is also preferable that the side wall spacer layer is made of silicon oxide.

It is also preferable that the side wall spacer layer is made of silicon nitride.

It is also preferable that rein the gate electrode comprises a polysilicon layer on which a metal silicide layer is formed.

It is also preferable that the side wall insulation film is made of one selected from the group consisting of silicon oxide and silicon nitride.

It is also preferable that laminations of the side wall spacer layers and the side wall insulation films extend on parts of the gate insulation film which are positioned over the lightly-doped diffusion layers.

If the side wall insulator and the side wall spacer layer are made of silicon oxide, this makes it easy to do an accurate control of etch-back to form the side wall silicon oxide films and the side wall silicon oxide spacer layers. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode and the source/drain diffusion layers.

The fourth present invention provides a method of forming a lightly-doped diffusion layer structure under a side wall insulator on a side wall of a gate electrode of a MOS field effect transistor. The method comprising the following steps. Side wall spacer layers are provided which extend at least on side walls of the gate electrode. A first ion-implantation is carried out by use of the gate electrode and the side wall spacer layers as masks to selectively form lightly-doped diffusion layers in a semiconductor substrate, so that inside edges of the lightly-doped diffusion layers are positioned under outside edges of the side wall spacer layers. Side wall insulation films are selectively formed on the side wall spacer layers. A second ion-implantation is carried out by use of the gate electrode, the side wall spacer layers and the side wall insulation films as masks to selectively form source/drain diffusion layers in the semiconductor substrate. The semiconductor substrate is subjected to a heat treatment to cause an activation of ions implanted by the second ion-implantation whereby ions implanted by the first ion-implantation are thermally diffused, thereby to allow the inside edges of the lightly-doped diffusion layers are inwardly diffused to a position under the side wall spacer layer so that the inside edge of the lightly-doped diffusion layer is positioned inside of the side wall insulator and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

It is preferable that the inside edge of the lightly-doped diffusion layer is positioned under an interface between the gate electrode and the side wall spacer layer.

It is also preferable that the inside edge of the lightly-doped diffusion layer is positioned under an interface between the side wall spacer layer and the side wall insulator.

It is also preferable that the inside edge of the lightly-doped diffusion layer is positioned under an intermediate position in a thickness direction of the side wall spacer layer.

It is also preferable that the side wall spacer layer has a thickness in the range of 5–10 nanometers.

It is also preferable that the side wall spacer layers are formed by subjecting the gate electrode to a thermal oxidation so that the side wall spacer layers are formed not only on the side walls of the gate electrode but also on a top surface of the gate electrode and then the side wall spacer layer over the top surface of the gate electrode is removed, provided that the gate electrode is made of polysilicon.

The above side wall spacer layer is formed by the thermal oxidation of the polysilicon gate electrode. This thermal oxidation process makes any residual polysilicon into silicon oxide which is electrically insulative. There is no drop of an insulating resistance between the adjacent two polysilicon gate electrodes. The polysilicon gate electrodes are defined by a dry etching to a polysilicon layer extending over the gate insulation film and also over the field oxide films. There are steps with a difference in level at boundaries between the gate insulation film and the field oxide films. In the dry etching process, the polysilicon layer is likely to reside on the steps between the gate insulation film and the field oxide films. The residual polysilicon films on the steps between the polysilicon gate insulation film and the field oxide films are, however, made into the silicon oxide film by the thermal oxidation process. The silicon oxide film prevents any leakage of current between the adjacent two polysilicon gate electrodes. No leakage of current between the adjacent two polysilicon gate electrodes appears even if the MOS field effect transistors are scaled down and the density of integration of the MOS field effect transistors is increased.

It is also preferable that the side wall spacer layers are formed by a chemical vapor deposition to deposit silicon oxide side wall spacer layers not only on the side walls of the gate electrode but also over a top surface of the gate electrode and also over the gate insulation film over the semiconductor substrate, and then the side wall spacer layers over the top surface of the gate electrode and also over the gate insulation film over the semiconductor substrate are removed.

If the side wall insulator and the side wall spacer layer are made of silicon oxide, this makes it easy to do an accurate control of etch-back to form the side wall silicon oxide films and the side wall silicon oxide spacer layers. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode and the source/drain diffusion layers.

It is also preferable that the side wall spacer layers are formed by a chemical vapor deposition to deposit silicon nitride side wall spacer layers not only on the side walls of the gate electrode but also over a top surface of the gate electrode and also over the gate insulation film over the semiconductor substrate, and then the side wall spacer layers over the top surface of the gate electrode and also over the gate insulation film over the semiconductor substrate are removed.

It is also preferable further comprise a step of, after the heat treatment, selectively forming metal silicide layers on the source/drain diffusion layers and the gate electrode, provided that the gate electrode is made of polysilicon. The metal silicide layers reduce the resistances of the source and drain diffusion layers even if the source and drain diffusion layers are extremely shallow. This allows the MOS field effect transistor both to exhibit high frequency and high sped performances and to be scaled down for increase in density of integration thereof.

It is also preferable that the side wall insulation films are formed by a chemical vapor deposition and subsequent subjecting the side wall insulation films to a reactive ion etching to leave the side wall insulation films only on the side wall spacer layers on the side walls of the gate electrode.

The fifth present invention provides a method of forming a lightly-doped diffusion layer structure under a side wall insulator on a side wall of a polysilicon gate electrode of a MOS field effect transistor. The method comprises the following steps. A polysilicon gate electrode is subjected to a thermal oxidation to form a thermal oxide film which extends on a top surface and side walls of the polysilicon gate electrode. A first ion-implantation is carried out by use of the gate electrode and the thermal oxide film as masks to selectively form lightly-doped diffusion layers in a semiconductor substrate, so that inside edges of the lightly-doped diffusion layers are positioned under outside edges of the thermal oxide film. A chemical vapor deposition is carried out to entirely deposit an insulation film on the thermal oxide film and on a gate insulation film over the semiconductor substrate. The insulation film and the thermal oxide film are subjected to a reactive-ion etching to leave the insulation film and the thermal oxide film only on the side walls of the gate electrode, thereby to form side wall spacer layers on the side walls of the gate electrode and side wall insulation films on the side wall spacer layers. A second ion-implantation is carried out by use of the gate electrode, the side wall spacer layers and the side wall insulation films as masks to selectively form source/drain diffusion layers in the semiconductor substrate. The semiconductor substrate is subjected to a heat treatment to cause an activation of ions implanted by the second ion-implantation whereby ions implanted by the first ion-implantation are thermally diffused, thereby to allow the inside edges of the lightly-doped diffusion layers are inwardly diffused to a position under the side wall spacer layer so that the inside edge of the lightly-doped diffusion layer is positioned inside of the side wall insulator and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

The above side wall spacer layer is formed by the thermal oxidation of the polysilicon gate electrode. This thermal oxidation process makes any residual polysilicon into silicon oxide which is electrically insulative. There is no drop of an insulating resistance between the adjacent two polysilicon gate electrodes. The polysilicon gate electrodes are defined by a dry etching to a polysilicon layer extending over the gate insulation film and also over the field oxide films. There are steps with a difference in level at boundaries between the gate insulation film and the field oxide films. In the dry etching process, the polysilicon layer is likely to reside on the steps between the gate insulation film and the field oxide films. The residual polysilicon films on the steps between the polysilicon gate insulation film and the field oxide films are, however, made into the silicon oxide film by the thermal oxidation process. The silicon oxide film prevents any leakage of current between the adjacent two polysilicon gate electrodes. No leakage of current between the adjacent two polysilicon gate electrodes appears even if the MOS field effect transistors are scaled down and the density of integration of the MOS field effect transistors is increased.

It is preferable that the inside edge of the lightly-doped diffusion layer is positioned under an interface between the gate electrode and the side wall spacer layer.

It is also preferable that the inside edge of the lightly-doped diffusion layer is positioned under an interface between the side wall spacer layer and the side wall insulator.

It is also preferable that the inside edge of the lightly-doped diffusion layer is positioned under an intermediate position in a thickness direction of the side wall spacer layer.

It is also preferable that the side wall spacer layer has a thickness in the range of 5–10 nanometers.

It is also preferable further comprise a step of, after the heat treatment, selectively forming metal silicide layers on the source/drain diffusion layers and the gate electrode, provided that the gate electrode is made of polysilicon. The metal silicide layers reduce the resistances of the source and drain diffusion layers even if the source and drain diffusion layers are extremely shallow. This allows the MOS field effect transistor both to exhibit high frequency and high speed performance and to be scaled down for increase in density of integration thereof.

If the side wall insulator and the side wall spacer layer are made of silicon oxide, this makes it easy to do an accurate control of etch-back to form the side wall silicon oxide films and the side wall silicon oxide spacer layers. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode and the source/drain diffusion layers.

The sixth present invention provides a method of forming a lightly-doped diffusion layer structure under a side wall insulator on a side wall of a gate electrode of a MOS field effect transistor. The method comprises the following steps. A first chemical vapor deposition is carried out to deposit a CVD-insulation layer which extends on a top surface and side walls of the gate electrode as well as over a gate insulation film over a semiconductor substrate. A first ion-implantation is carried out by use of the gate electrode and parts of the insulation layers on the side walls of the gate electrode as masks to selectively form lightly-doped diffusion layers in the semiconductor substrate, so that inside edges of the lightly-doped diffusion layers are positioned under outside edges of the CVD-insulation layer on the side wall of the gate electrode. A second chemical vapor deposition is carried out to entirely deposit an insulation film on the CVD-insulation layer. The insulation film and the CVD-insulation layer are subjected to a reactive-ion etching to leave the insulation film and the CVD-insulation layer only on the side walls of the gate electrode, thereby to form side wall spacer layers on the side walls of the gate electrode and side wall insulation films on the side wall spacer layers. A second ion-implantation is carried out by use of the gate electrode, the side wall spacer layers and the side wall insulation films as masks to selectively form source/drain diffusion layers in the semiconductor substrate. The semiconductor substrate is subjected to a heat treatment to cause an activation of ions implanted by the second ion-implantation whereby ions implanted by the first ion-implantation are thermally diffused, thereby to allow the inside edges of the lightly-doped diffusion layers are inwardly diffused to a position under the side wall spacer layer so that the inside edge of the lightly-doped diffusion layer is positioned inside of the side wall insulator and outside of the gate electrode as illustrated in FIG. 3.

The above novel lightly-doped diffusion layer structure provides no overlap of the lightly-doped diffusion layer and the gate electrode. Namely, the lightly-doped diffusion layers are formed by ion-implantation of the impurity by use of the gate electrode and the side wall spacer layer as the masks whereby the inside edges of the lightly doped diffusion layers are positioned under the outside edge of the side wall spacer layer. Thereafter, to form the source and drain diffusion layers, a heat treatment is caused. This heat treatment causes further diffusions inwardly of the lightly doped diffusion layers, whereby the inside edges of the lightly doped diffusion layers are moved into inside of the side wall insulation film but outside of the outside edge of the gate electrode. As a result, the inside edge of the lightly doped diffusion layer is positioned under the side wall spacer layer, for which reason there is formed no overlap between the lightly doped diffusion layers and the gate electrode. Even if the 0.25 micrometers scale rule is applied to design of the MOS field effect transistor, no overlap between the lightly doped diffusion layers and the gate electrode is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers and the gate electrode results in a remarkable improvement in resistivity to hot-electron.

It is preferable that the inside edge of the lightly-doped diffusion layer is positioned under an interface between the gate electrode and the side wall spacer layer.

It is also preferable that the inside edge of the lightly-doped diffusion layer is positioned under an interface between the side wall spacer layer and the side wall insulator.

It is also preferable that the inside edge of the lightly-doped diffusion layer is positioned under an intermediate position in a thickness direction of the side wall spacer layer.

It is also preferable that the side wall spacer layer has a thickness in the range of 5–10 nanometers.

It is also preferable that the side wall spacer layers are made of silicon oxide.

It is also preferable that the side wall spacer layers are made of silicon nitride.

If the side wall insulator and the side wall spacer layer are made of silicon oxide, this makes it easy to do an accurate control of etch-back to form the side wall silicon oxide films and the side wall silicon oxide spacer layers. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode and the source/drain diffusion layers.

It is also preferable to further comprise a step of, after the heat treatment, selectively forming metal silicide layers on the source/drain diffusion layers and the gate electrode, provided that the gate electrode is made of polysilicon. The metal silicide layers reduce the resistances of the source and drain diffusion layers even if the source and drain diffusion layers are extremely shallow. This allows the MOS field effect transistor both to exhibit high frequency and high speed performance and to be scaled down for increase in density of integration thereof.

PREFERRED EMBODIMENTS

First Embodiment

Figure 4:
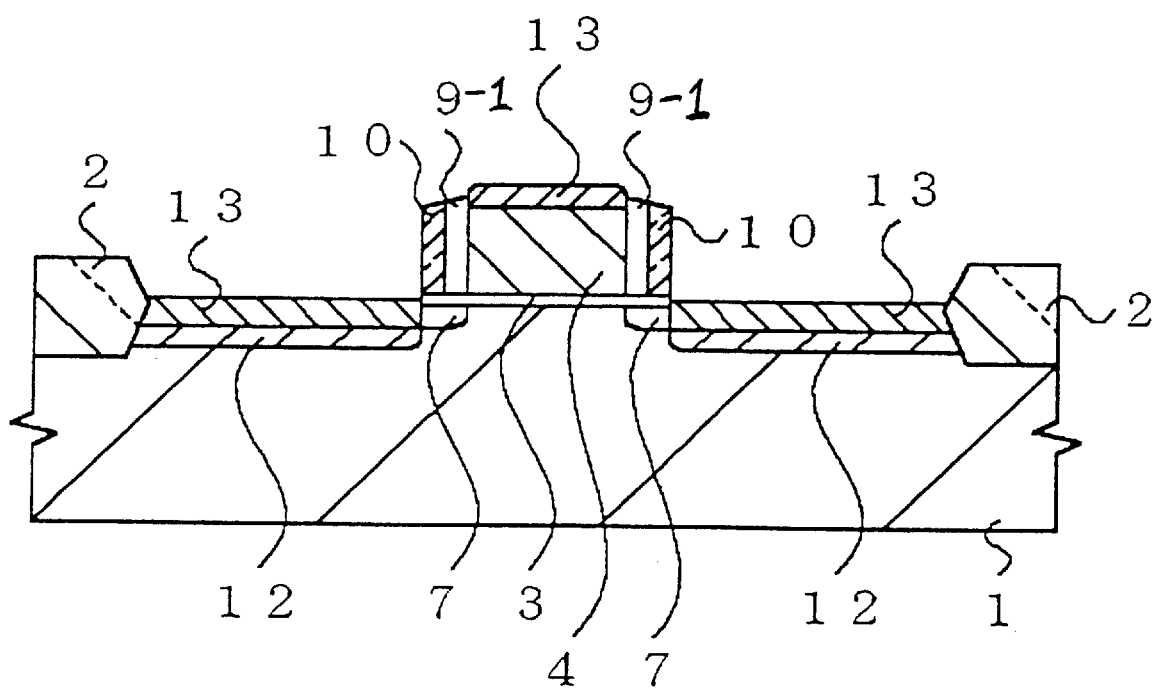
FIG. 4 is a fragmentary cross sectional elevation view illustrative of a novel MOS field effect transistor with an improved lightly-doped diffusion layer structure in a first embodiment in accordance with the present invention.

A first embodiment according to the present invention will be described in detail with reference to FIG. 4 which is a fragmentary cross sectional elevation view illustrative of a novel MOS field effect transistor with an improved lightly-doped diffusion layer structure.

A structure of a novel MOS field effect transistor will be described as follows. Field oxide films 2 are selectively provided on a top surface of a p-type silicon substrate 1 to define an active region of the silicon substrate 1. A gate oxide film 3 is formed on the active region of the silicon substrate 1. A polysilicon gate electrode 4 is selectively provided on the gate oxide film 3. Side wall spacer layers 9-1 of thermal oxide films are selectively provided on side walls of the polysilicon gate electrode 4 and over the gate oxide film 3. Further, CVD silicon oxide side wall insulation films 10 are also selectively provided on the thermal oxide side wall spacer layers 9-1 and over the gate oxide film 3 so as to form laminations of the thermal oxide side wall spacer layers 9-1 and the CVD silicon oxide side wall insulation films 10. Source and drain diffusion layers 12 are selectively provided in upper regions of the silicon substrate 1. Titanium silicide layers 13 are provided on upper regions of the source and drain diffusion layers 12 and further an upper region of the polysilicon gate electrode 4. Lightly-doped diffusion layers 7 are further provided which extend from the inside edges of the source and drain diffusion layers 12 through the upper regions of the silicon substrate 1 so that the lightly-doped diffusion layers 7 are positioned under the laminations of the thermal oxide side wall spacer layers 9-1 and the CVD silicon oxide side wall insulation films 10. The inside edges of the lightly-doped diffusion layers 7 are positioned inside of the CVD silicon oxide side wall insulation films 10 and outside of the polysilicon gate electrode. Namely, the inside edges of the lightly-doped diffusion layers 7 are positioned under the inside edges of the lightly-doped diffusion layers 7. The thermal oxide side wall spacer layers 9-1 may have a thickness in the range of 5–10 nanometers.

Subsequently, a novel fabrication method of the above improved MOS field effect transistor will be described with reference to FIGS. 5A through 5F which are fragmentary cross sectional elevation views illustrative of novel MOS field effect transistors in sequential steps involved in a novel fabrication method.

Figure 5A:
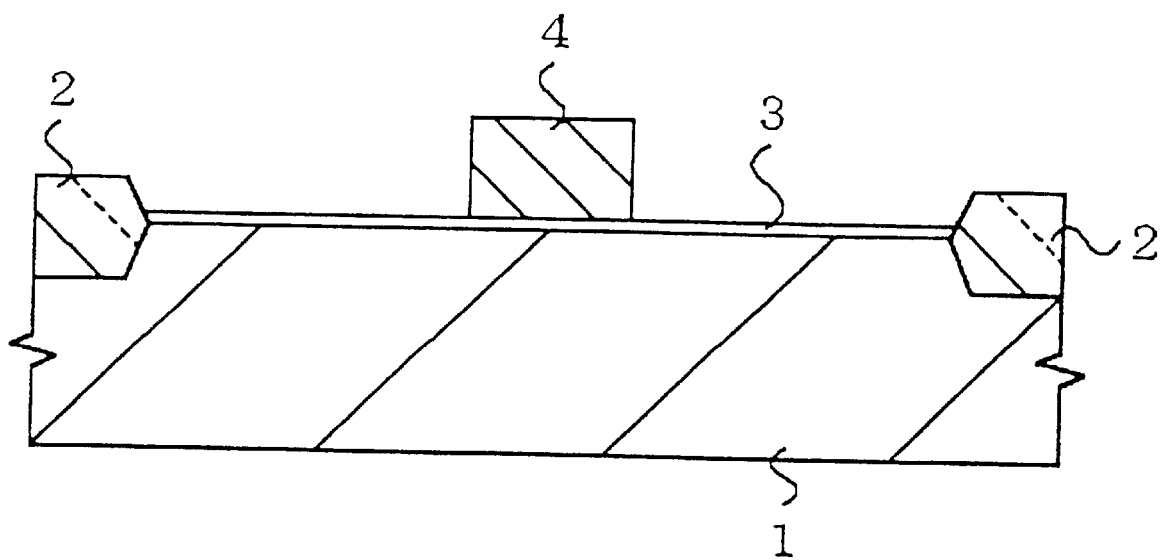
FIGS. 5A through 5F are fragmentary cross sectional elevation views illustrative of novel MOS field effect transistors in sequential steps involved in a novel fabrication method in a first embodiment in accordance with the present invention.

With reference to FIG. 5A, a p-type silicon substrate 1 is used. Field oxide films 2 are selectively formed on a surface of the p-type silicon substrate 1 to define an active region on which a MOS field effect transistor will be formed. A gate oxide film 3 having a thickness of about 6 manometers is formed on an active region of the p-type silicon substrate 1. A phosphorus-doped polysilicon layer having a thickness of about 300 manometers is entirely formed which extends over the field oxide films 2 and the gate oxide film 3. The polysilicon layer is then subjected to a dry etching to selectively remove the polysilicon layer, whereby a polysilicon gate electrode 4 is formed on the gate oxide film 3.

Figure 5B:
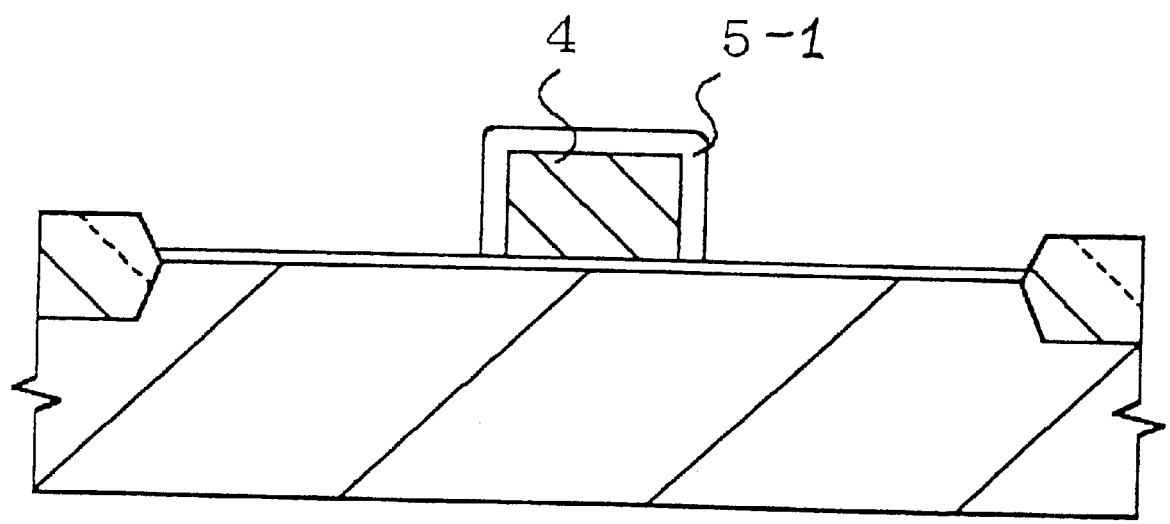

With reference to FIG. 5B, the polysilicon gate electrode 4 is subjected to a thermal oxidation process whereby a thermal oxide film 5-1 is formed which extends over a top surface of the polysilicon gate electrode 4 and extends on side walls of the polysilicon gate electrode 4. The thermal oxide film 5-1 has a thickness of about 5 nanometers. The thermal oxidation process is carried out at a temperature of 850° C. in an oxygen gas. In this thermal oxidation process, any residual polysilicon particularly on steps between the gate oxide film 3 and the field oxide films 2 after the dry etching process are made into silicon oxide.

Figure 5C:
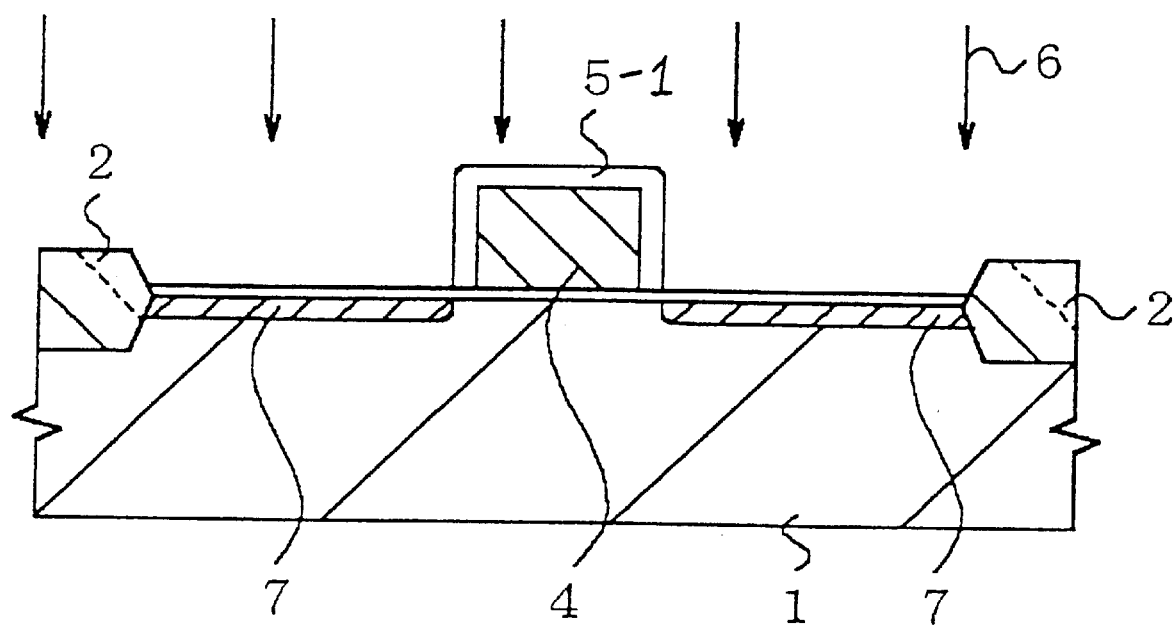

With reference to FIG. 5C, not only the field oxide films 2 and the polysilicon gate electrode 4 but also the thermal oxide film 5-1 are used as masks for ion-implantation of an n-type impurity 6 into the surface region of the p-type silicon substrate 1 and subsequent heat treatment to the p-type silicon substrate 1 for causing a thermal diffusion of ion-implanted n-type impurity, whereby shallow lightly-doped diffusion regions 7 are formed in upper regions of the p-type silicon substrate 1 except not only under the field oxide films 2 and the gate electrode 4 but also under the thermal oxide film 5-1. As a result, inside edges of the lightly doped diffusion layers 7 are positioned under outside edges of the thermal oxide film 5-1. There is no overlap between the lightly doped diffusion layers 7 and the polysilicon gate electrode 4.

Figure 5D:
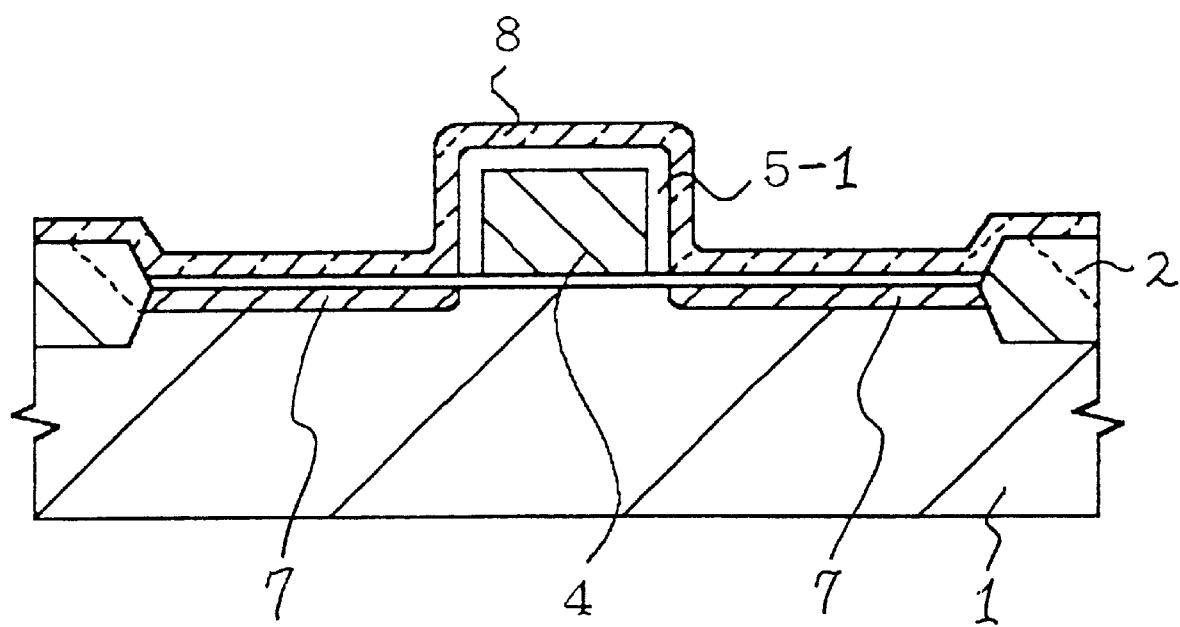

With reference to FIG. 5D, a chemical vapor deposition is carried out to entirely deposit a CVD silicon oxide film 8 having a thickness of about 100 nanometers so that the silicon oxide film 8 covers the field oxide films 2 and the gate oxide film 3 over the lightly doped diffusion regions 7 as well as side walls and a top surface of the thermal oxide film 5-1. The chemical vapor deposition is carried out by use of a tetra-ethyl-ortho-silicate gas (TEOS gas) as an organic silane source gas. If the chemical vapor deposition is carried out using the organic silane gas, the quality of the CVD silicon oxide film 8 deposited by the chemical vapor deposition is likely to depend largely upon the base layer. In this case, however, the base layer comprises the thermal silicon oxide film 5-1. This ensues a high quality of the CVD silicon oxide film 8.

Figure 5E:
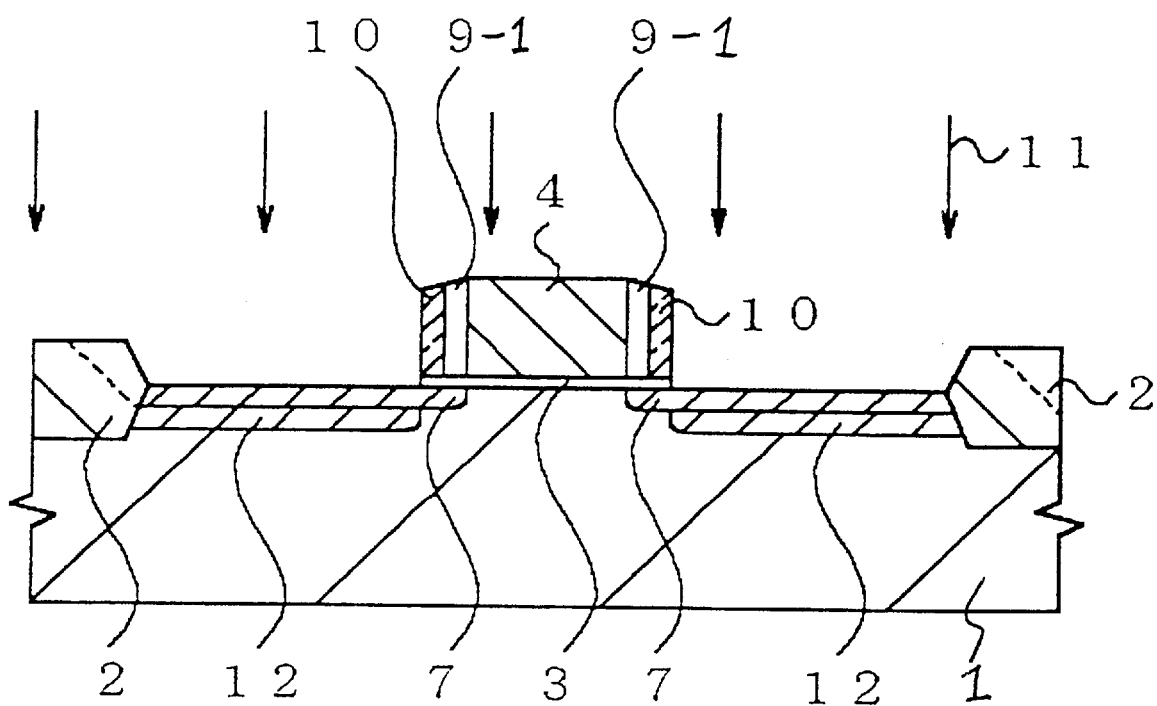

With reference to FIG. 5E, a reactive ion etching is carried out to the CVD silicon oxide film 8 and the thermal oxide film 5-1 so that the CVD silicon oxide film 8 and the thermal oxide film 5-1 are subjected to an etch-back whereby laminations of the CVD silicon oxide film 8 and the thermal oxide film 5-1 remain only on the side walls of the polysilicon gate electrode 4. As a result, the laminations of the CVD silicon oxide film 8 and the thermal oxide film 5-1 are made into laminations of a CVD silicon oxide side wall insulation film 10 and a thermal oxide side wall spacer layers 9-1 which are provided on the side walls of the polysilicon gate electrode 4. An ion-implantation of an n-type impurity 11 into the silicon substrate 1 is carried out by use of the CVD silicon oxide side wall insulation film 10 and the thermal oxide side wall spacer layers 9-1 as masks for subsequent heat treatment thereby to form source/drain diffusion layers 12. As a result, the source/drain diffusion layers 12 have inside edges which are positioned under the outside edges of the CVD silicon oxide side wall insulation films 10. Namely, the boundaries between the source/drain diffusion layers 12 and the lightly doped diffusion layers 7 are positioned under the outside edges of the CVD silicon oxide side wall insulation films 10. The above heat treatment causes further diffusions of the lightly doped diffusion layers 7 inwardly so that the inside edges of the lightly-doped diffusion layers are diffused to positions under the thermal oxide side wall spacer layers 9-1. As a result, the inside edges of the lightly-doped diffusion layers 7 are positioned inside of the CVD silicon oxide side wall insulation films 10 and outside of the gate electrode 4.

Figure 5F:
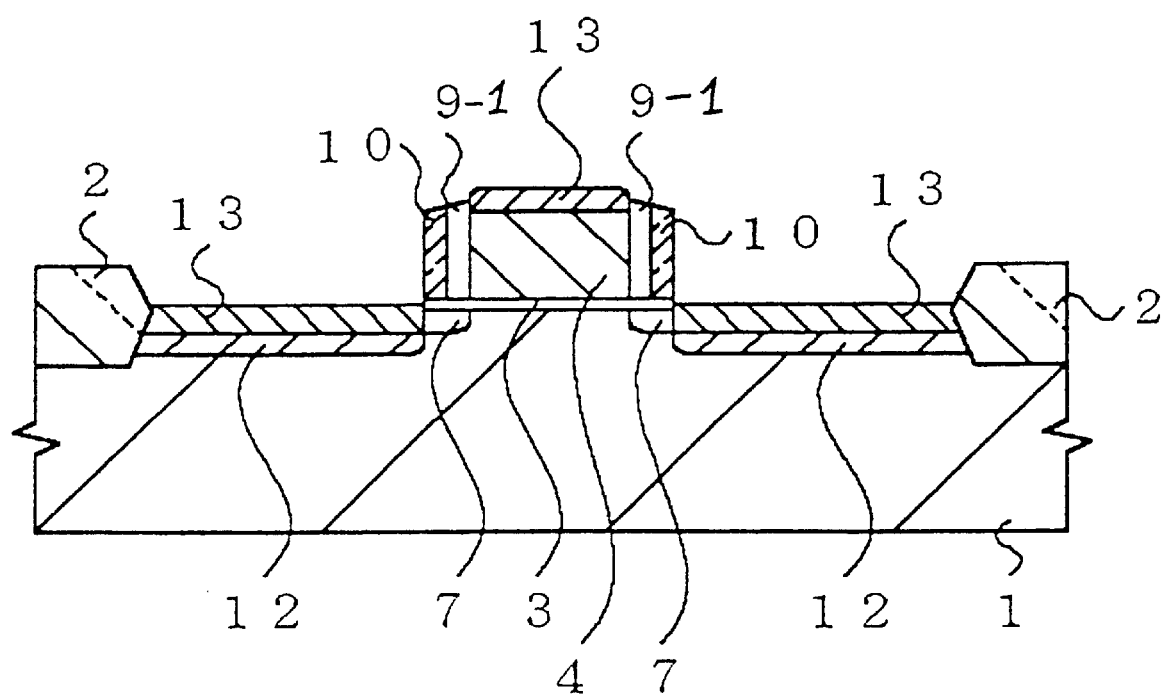

With reference to FIG. 5F, a titanium film having a thickness of about 30 nanometers is entirely deposited which extends on the field oxide films 2 and over the source/drain diffusion layers 12 as well as on the CVD silicon oxide side wall insulation films 10 and over the thermal oxide side wall spacer layers 9-1 and a top surface of the polysilicon gate electrode 4. A heat treatment to the silicon substrate 1 in an inert gas such as a nitrogen gas to cause a selective silicidation reaction between silicon and titanium atoms whereby titanium silicide layers 13 are selectively formed on the top surface of the polysilicon gate electrode 4 and on the source/drain diffusion layers 12, whilst no silicidation reaction is caused over the field oxide films 2 and on the CVD silicon oxide side wall insulation films 10 and the thermal oxide side wall spacer layers 9-1. The unreacted titanium film is removed.

The source/drain diffusion layers 12 have the refractory metal silicide layers 13 and the lightly-doped diffusion layers 7. The polysilicon gate electrode 4 also has the refractory metal silicide layers 13.

The above novel lightly-doped diffusion layer structure provides no overlap of the lightly-doped diffusion layer 7 and the gate electrode 4. Namely, the lightly-doped diffusion layers 7 are formed by ion-implantation of the impurity by use of the gate electrode 4 and the thermal oxide side wall spacer layers 9-1 as the masks whereby the inside edges of the lightly doped diffusion layers 7 are positioned under the outside edges of the thermal oxide side wall spacer layers 9-1. Thereafter, to form the source and drain diffusion layers 12, a heat treatment is caused. This heat treatment causes further diffusions inwardly of the lightly doped diffusion layers 7, whereby the inside edges of the lightly doped diffusion layers 7 are moved into inside of the CVD silicon oxide side wall insulation films 10 but outside of the outside edge of the gate electrode 4. As a result, the inside edges of the lightly doped diffusion layers 7 are positioned under the thermal oxide side wall spacer layers 9-1, for which reason there is formed no overlap between the lightly doped diffusion layers 7 and the gate electrode 4. Even if the 0.25 micrometers scale rule is applied to design of the MOS field effect transistor, no overlap between the lightly doped diffusion layers 7 and the gate electrode 4 is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers 7 and the gate electrode 4 results in a remarkable improvement in resistivity to hot-electron. In the light of a life-time defined by a 10% reduction of a mutual conductance of the MOS field effect transistor, the above novel MOS field effect transistor has a life-time which is longer by one-order than that of the conventional MOS field effect transistor.

Since the CVD silicon oxide side wall insulation films 10 and the thermal oxide side wall spacer layers 9-1 are made of silicon oxide, this makes it easy to do an accurate control of etch-back to form the CVD silicon oxide side wall insulation films 10 and the thermal oxide side wall spacer layers 9-1. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode 4 and the source/drain diffusion layers 12.

The above thermal oxide side wall spacer layers 9-1 is formed by the thermal oxidation of the polysilicon gate electrode 4. This thermal oxidation process makes any residual polysilicon into silicon oxide which is electrically insulative. There is no drop of an insulating resistance between the adjacent two polysilicon gate electrodes 4. The polysilicon gate electrodes 4 are defined by a dry etching to a polysilicon layer extending over the gate insulation film 3 and also over the field oxide films 2. There are steps with a difference in level at boundaries between the gate insulation film 3 and the field oxide films 2. In the dry etching process, the polysilicon layer is likely to reside on the steps between the gate insulation film 3 and the field oxide films 2. The residual polysilicon films on the steps between the polysilicon gate insulation film 3 and the field oxide films 2 are, however, made into the silicon oxide film by the thermal oxidation process. The silicon oxide film prevents any leakage of current between the adjacent two polysilicon gate electrodes 4. No leakage of current between the adjacent two polysilicon gate electrodes 4 appears even if the MOS field effect transistors are scaled down and the density of integration of the MOS field effect transistors is increased.

Second Embodiment

Figure 6:
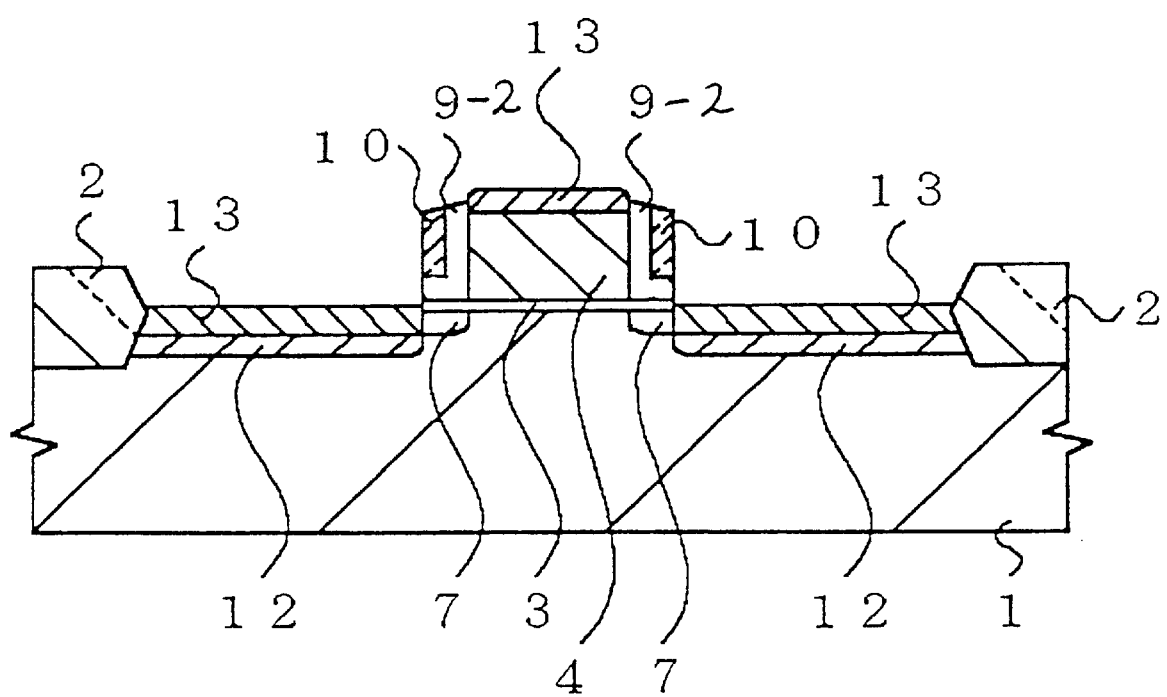
FIG. 6 is a fragmentary cross sectional elevation view illustrative of a novel MOS field effect transistor with an improved lightly-doped diffusion layer structure in a second embodiment in accordance with the present invention.

A second embodiment according to the present invention will be described in detail with reference to FIG. 6 which is a fragmentary cross sectional elevation view illustrative of a novel MOS field effect transistor with an improved lightly-doped diffusion layer structure.

A structure of a novel MOS field effect transistor will be described as follows. Field oxide films 2 are selectively provided on a top surface of a p-type silicon substrate 1 to define an active region of the silicon substrate 1. A gate oxide film 3 is formed on the active region of the silicon substrate 1. A polysilicon gate electrode 4 is selectively provided on the gate oxide film 3. Side wall spacer layers 9-2 of thermal oxide films are selectively provided on side walls of the polysilicon gate electrode 4 and over the gate oxide film 3. Further, CVD silicon oxide side wall insulation films 10 are also selectively provided on the CVD oxide side wall spacer layers 9-2 and over the gate oxide film 3 so as to form laminations of the CVD oxide side wall spacer layers 9-2 and the CVD silicon oxide side wall insulation films 10. Source and drain diffusion layers 12 are selectively provided in upper regions of the silicon substrate 1. Titanium silicide layers 13 are provided on upper regions of the source and drain diffusion layers 12 and further an upper region of the polysilicon gate electrode 4. Lightly-doped diffusion layers 7 are further provided which extend from the inside edges of the source and drain diffusion layers 12 through the upper regions of the silicon substrate 1 so that the lightly-doped diffusion layers 7 are positioned under the laminations of the CVD oxide side wall spacer layers 9-2 and the CVD silicon oxide side wall insulation films 10. The inside edges of the lightly-doped diffusion layers 7 are positioned inside of the CVD silicon oxide side wall insulation films 10 and outside of the polysilicon gate electrode. Namely, the inside edges of the lightly-doped diffusion layers 7 are positioned under the inside edges of the lightly-doped diffusion layers 7. The CVD oxide side wall spacer layers 9-2 may have a thickness in the range of 5–10 nanometers.

Subsequently, a novel fabrication method of the above improved MOS field effect transistor will be described with reference to FIGS. 7A through 7F which are fragmentary cross sectional elevation views illustrative of novel MOS field effect transistors in sequential steps involved in a novel fabrication method.

Figure 7A:
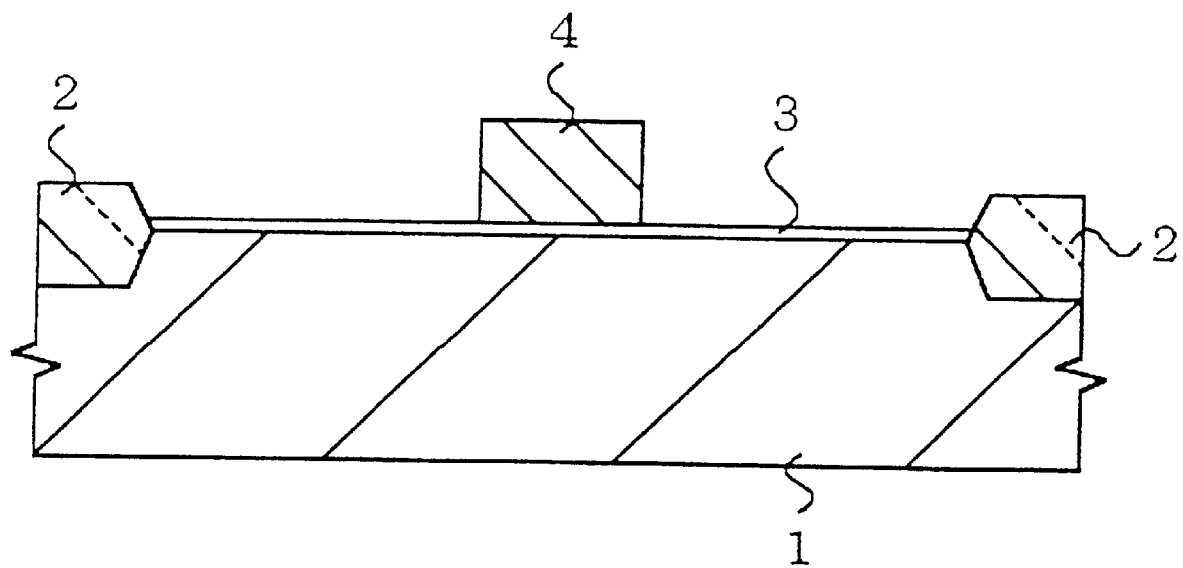
FIGS. 7A through 7F are fragmentary cross sectional elevation views illustrative of novel MOS field effect transistors in sequential steps involved in a novel fabrication method in a second embodiment in accordance with the present invention.

With reference to FIG. 7A, a p-type silicon substrate 1 is used. Field oxide films 2 are selectively formed on a surface of the p-type silicon substrate 1 to define an active region on which a MOS field effect transistor will be formed. A gate oxide film 3 having a thickness of about 6 manometers is formed on an active region of the p-type silicon substrate 1. A phosphorus-doped polysilicon layer having a thickness of about 300 manometers is entirely formed which extends over the field oxide films 2 and the gate oxide film 3. The polysilicon layer is then subjected to a dry etching to selectively remove the polysilicon layer, whereby a polysilicon gate electrode 4 is formed on the gate oxide film 3.

Figure 7B:
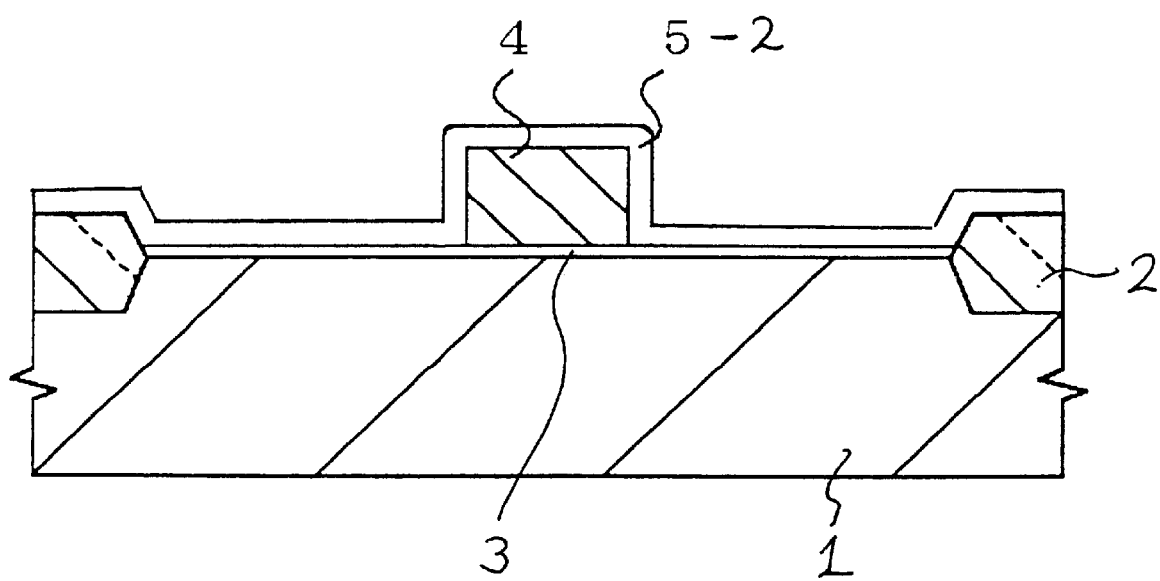

With reference to FIG. 7B, a chemical vapor deposition is carried out to entirely deposit a silicon oxide film 5-2 whereby a CVD oxide film 5-2 is formed which extends over a top surface of the polysilicon gate electrode 4 and extends on side walls of the polysilicon gate electrode 4 as well as extends over the gate oxide films 3 and the field oxide films 2. The CVD oxide film 5-2 has a thickness of about 5 nanometers.

Figure 7C:
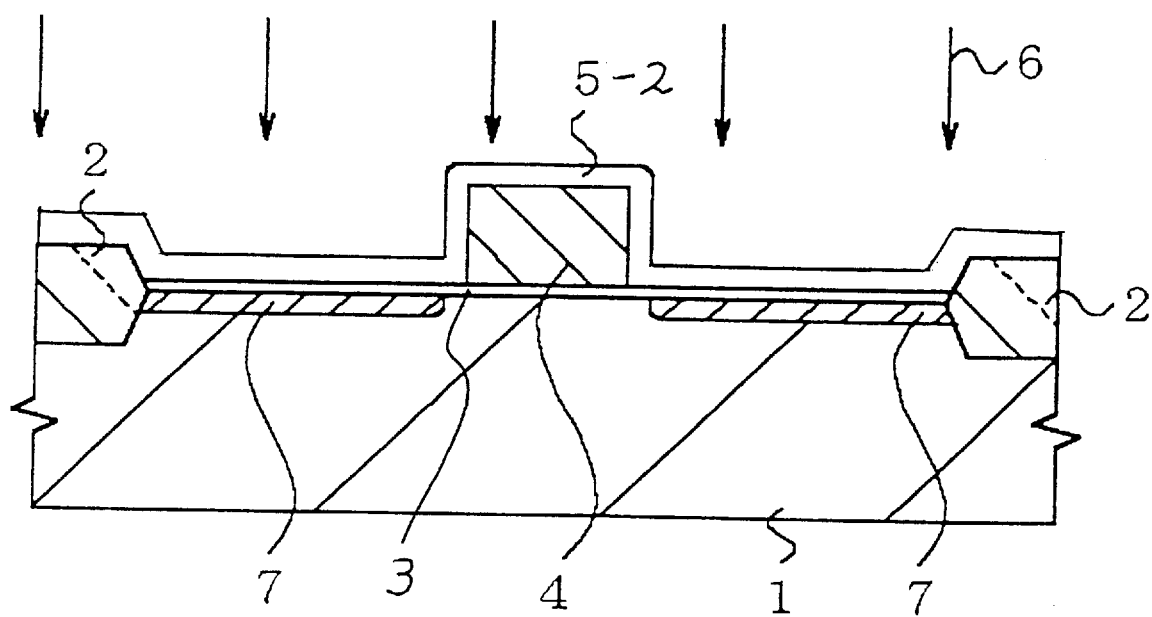

With reference to FIG. 7C, not only the field oxide films 2 and the polysilicon gate electrode 4 but also vertically extending parts of the CVD oxide film 5-2 on the side walls of the gate electrode 4 are used as masks for ion-implantation of an n-type impurity 6 into the surface region of the p-type silicon substrate 1 and subsequent heat treatment to the p-type silicon substrate 1 for causing a thermal diffusion of ion-implanted n-type impurity, whereby shallow lightly-doped diffusion regions 7 are formed in upper regions of the p-type silicon substrate 1 except not only under the field oxide films 2 and the gate electrode 4 but also under the vertically extending parts of the CVD oxide film 5-2 on the side walls of the gate electrode 4. As a result, inside edges of the lightly doped diffusion layers 7 are positioned under outside edges of the CVD oxide films 5-2. There is no overlap between the lightly doped diffusion layers 7 and the polysilicon gate electrode 4.

Figure 7D:
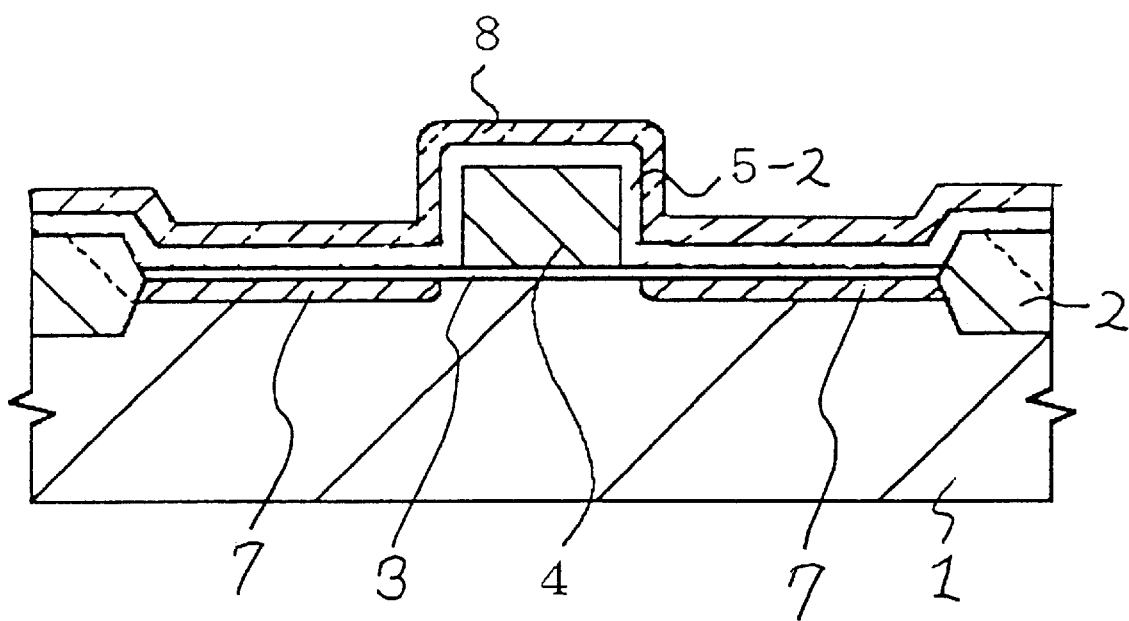

With reference to FIG. 7D, a chemical vapor deposition is carried out to entirely deposit a CVD silicon oxide film 8 having a thickness of about 100 nanometers so that the silicon oxide film 8 covers the field oxide films 2 and the CVD oxide film 5-2. The chemical vapor deposition is carried out by use of a tetra-ethyl-ortho-silicate gas (TEOS gas) as an organic silane source gas. If the chemical vapor deposition is carried out using the organic silane gas, the quality of the CVD silicon oxide film 8 deposited by the chemical vapor deposition is likely to depend largely upon the base layer. In this case, however, the base layer comprises the CVD oxide film 5-2. This ensues a high quality of the CVD silicon oxide film 8.

Figure 7E:
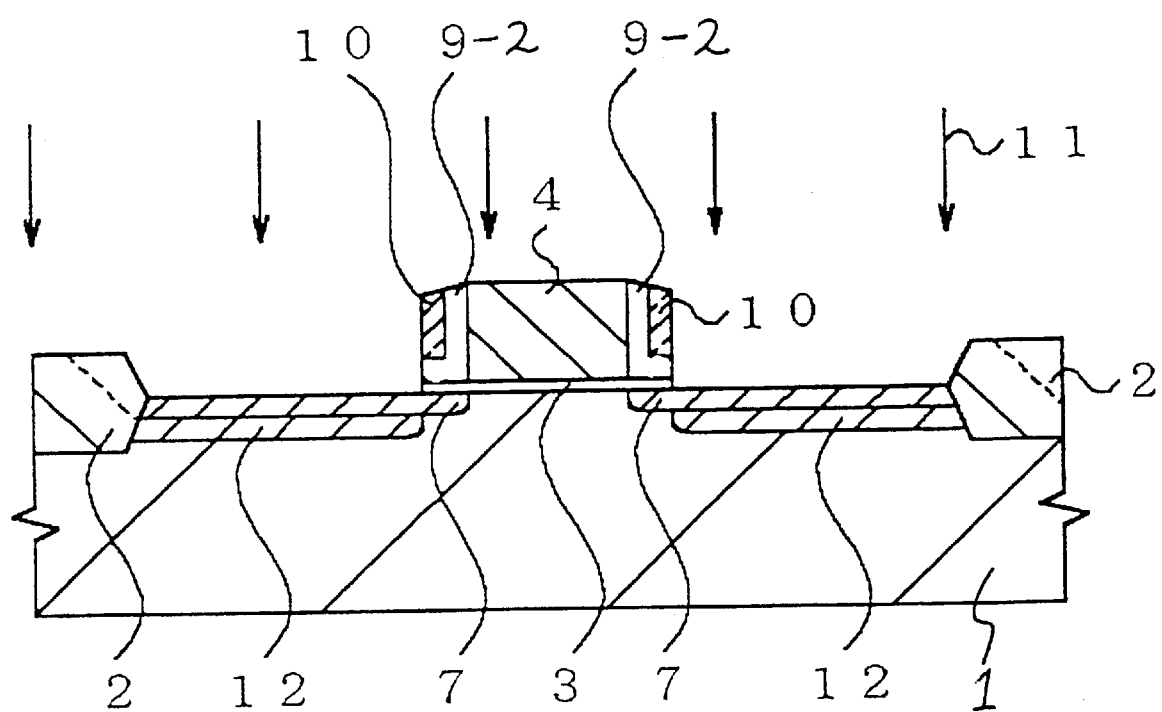

With reference to FIG. 7E, a reactive ion etching is carried out to the CVD silicon oxide film 8 and the CVD oxide film 5-2 so that the CVD silicon oxide film 8 and the CVD oxide film 5-2 are subjected to an etch-back whereby laminations of the CVD silicon oxide film 8 and the CVD oxide film 5-2 remain only on the side walls of the polysilicon gate electrode 4. As a result, the laminations of the CVD silicon oxide film 8 and the CVD oxide film 5-2 are made into laminations of a CVD silicon oxide side wall insulation film 10 and a CVD oxide side wall spacer layer 9-2 which are provided on the side walls of the polysilicon gate electrode 4. An ion-implantation of an n-type impurity 11 into the silicon substrate 1 is carried out by use of the CVD silicon oxide side wall insulation film 10 and the CVD oxide side wall spacer layers 9-2 as masks for subsequent heat treatment thereby to form source/drain diffusion layers 12. As a result, the source/drain diffusion layers 12 have inside edges which are positioned under the outside edges of the CVD silicon oxide side wall insulation films 10. Namely, the boundaries between the source/drain diffusion layers 12 and the lightly doped diffusion layers 7 are positioned under the outside edges of the CVD silicon oxide side wall insulation films 10. The above heat treatment causes further diffusions of the lightly doped diffusion layers 7 inwardly so that the inside edges of the lightly-doped diffusion layers are diffused to positions under the CVD oxide side wall spacer layers 9-2. As a result, the inside edges of the lightly-doped diffusion layers 7 are positioned inside of the CVD silicon oxide side wall insulation films 10 and outside of the gate electrode 4.

Figure 7F:
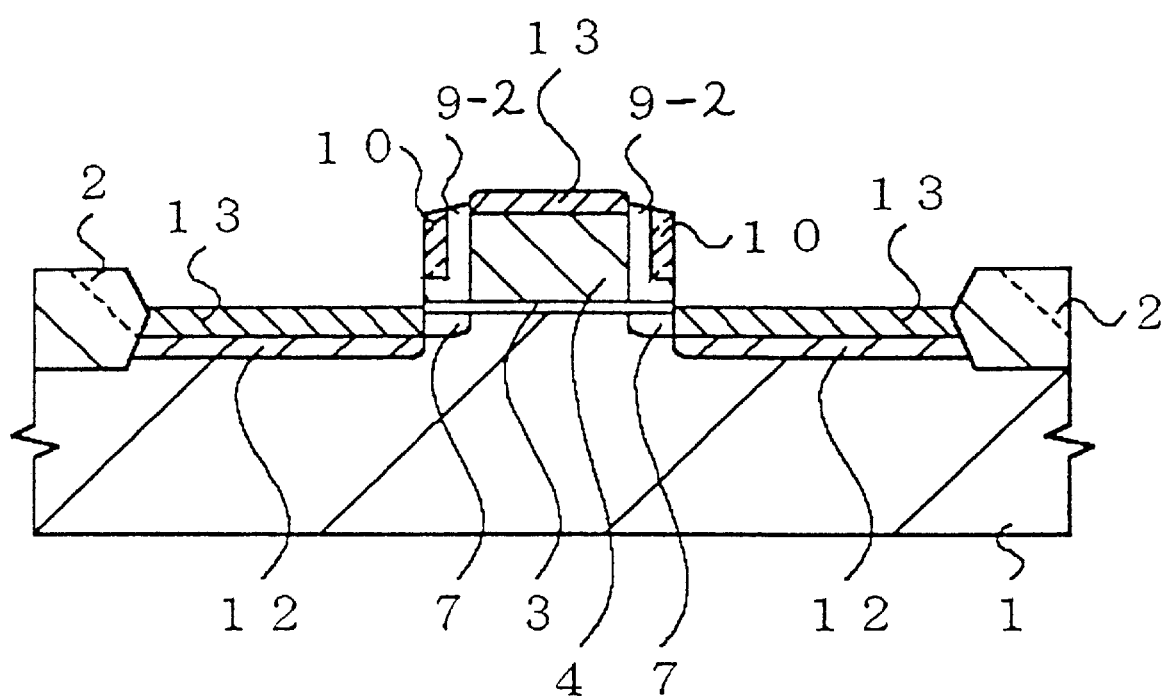

With reference to FIG. 7F, a titanium film having a thickness of about 30 nanometers is entirely deposited which extends on the field oxide films 2 and over the source/drain diffusion layers 12 as well as on the CVD silicon oxide side wall insulation films 10 and over the CVD oxide side wall spacer layers 9-2 and a top surface of the polysilicon gate electrode 4. A heat treatment to the silicon substrate 1 in an inert gas such as a nitrogen gas to cause a selective silicidation reaction between silicon and titanium atoms whereby titanium silicide layers 13 are selectively formed on the top surface of the polysilicon gate electrode 4 and on the source/drain diffusion layers 12, whilst no silicidation reaction is caused over the field oxide films 2 and on the CVD silicon oxide side wall insulation films 10 and the CVD oxide side wall spacer layers 9-2. The unreacted titanium film is removed.

The source/drain diffusion layers 12 have the refractory metal silicide layers 13 and the lightly-doped diffusion layers 7. The polysilicon gate electrode 4 also has the refractory metal silicide layers 13.

The above novel lightly-doped diffusion layer structure provides no overlap of the lightly-doped diffusion layer 7 and the gate electrode 4. Namely, the lightly-doped diffusion layers 7 are formed by ion-implantation of the impurity by use of the gate electrode 4 and the CVD oxide side wall spacer layers 9-2 as the masks whereby the inside edges of the lightly doped diffusion layers 7 are positioned under the outside edges of the CVD oxide side wall spacer layers 9-2. Thereafter, to form the source and drain diffusion layers 12, a heat treatment is caused. This heat treatment causes further diffusions inwardly of the lightly doped diffusion layers 7, whereby the inside edges of the lightly doped diffusion layers 7 are moved into inside of the CVD silicon oxide side wall insulation films 10 but outside of the outside edge of the gate electrode 4. As a result, the inside edges of the lightly doped diffusion layers 7 are positioned under the CVD oxide side wall spacer layers 9-2, for which reason there is formed no overlap between the lightly doped diffusion layers 7 and the gate electrode 4. Even if the 0.25 micrometers scale rule is applied to design of the MOS field effect transistor, no overlap between the lightly doped diffusion layers 7 and the gate electrode 4 is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers 7 and the gate electrode 4 results in a remarkable improvement in resistivity to hot-electron.

Since the CVD silicon oxide side wall insulation films 10 and the CVD oxide side wall spacer layers 9-2 are made of silicon oxide, this makes it easy to do an accurate control of etch-back to form the CVD silicon oxide side wall insulation films 10 and the CVD oxide side wall spacer layers 9-2. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode 4 and the source/drain diffusion layers 12.

Third Embodiment

Figure 8:
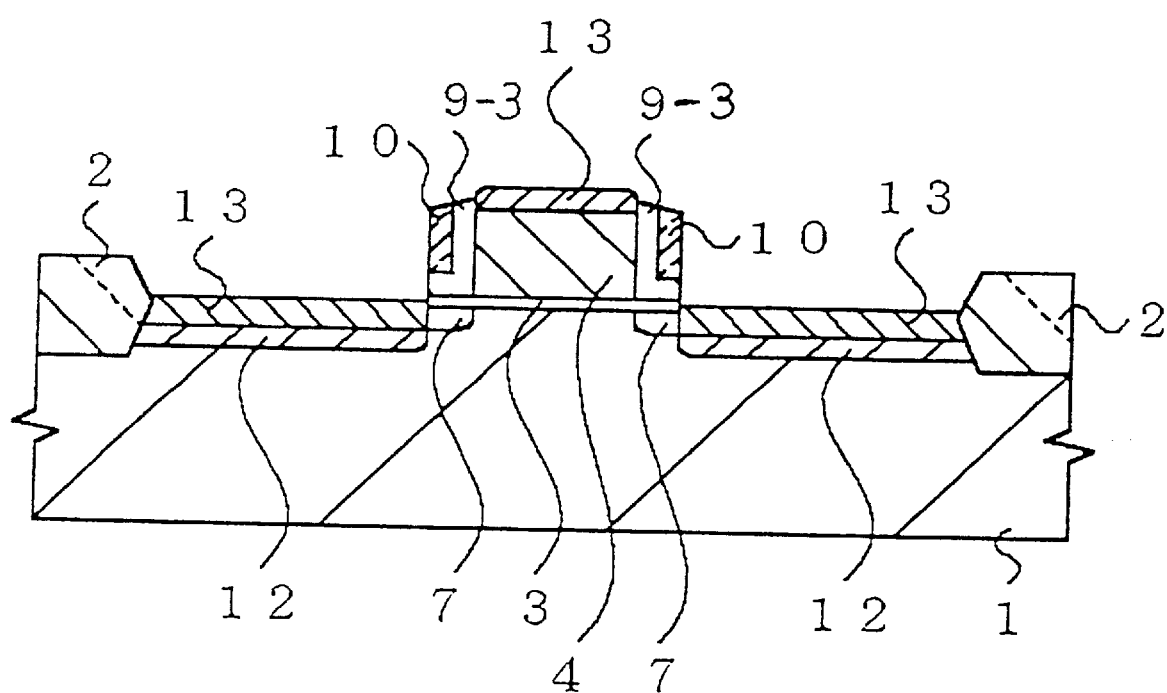
FIG. 8 is a fragmentary cross sectional elevation view illustrative of a novel MOS field effect transistor with an improved lightly-doped diffusion layer structure in a third embodiment in accordance with the present invention.

A third embodiment according to the present invention will be described in detail with reference to FIG. 8 which is a fragmentary cross sectional elevation view illustrative of a novel MOS field effect transistor with an improved lightly-doped diffusion layer structure.

A structure of a novel MOS field effect transistor will be described as follows. Field oxide films 2 are selectively provided on a top surface of a p-type silicon substrate 1 to define an active region of the silicon substrate 1. A gate oxide film 3 is formed on the active region of the silicon substrate 1. A polysilicon gate electrode 4 is selectively provided on the gate oxide film 3. Side wall spacer layers 9-3 of thermal oxide films are selectively provided on side walls of the polysilicon gate electrode 4 and over the gate oxide film 3. Further, CVD silicon oxide side wall insulation films 10 are also selectively provided on the CVD nitride side wall spacer layers 9-3 and over the gate oxide film 3 so as to form laminations of the CVD nitride side wall spacer layers 9-3 and the CVD silicon oxide side wall insulation films 10. Source and drain diffusion layers 12 are selectively provided in upper regions of the silicon substrate 1. Titanium silicide layers 13 are provided on upper regions of the source and drain diffusion layers 12 and further an upper region of the polysilicon gate electrode 4. Lightly-doped diffusion layers 7 are further provided which extend from the inside edges of the source and drain diffusion layers 12 through the upper regions of the silicon substrate 1 so that the lightly-doped diffusion layers 7 are positioned under the laminations of the CVD nitride side wall spacer layers 9-3 and the CVD silicon oxide side wall insulation films 10. The inside edges of the lightly-doped diffusion layers 7 are positioned inside of the CVD silicon oxide side wall insulation films 10 and outside of the polysilicon gate electrode. Namely, the inside edges of the lightly-doped diffusion layers 7 are positioned under the inside edges of the lightly-doped diffusion layers 7. The CVD nitride side wall spacer layers 9-3 may have a thickness in the range of 5–10 nanometers.

Subsequently, a novel fabrication method of the above improved MOS field effect transistor will be described with reference to FIGS. 9A through 9F which are fragmentary cross sectional elevation views illustrative of novel MOS field effect transistors in sequential steps involved in a novel fabrication method.

Figure 9A:
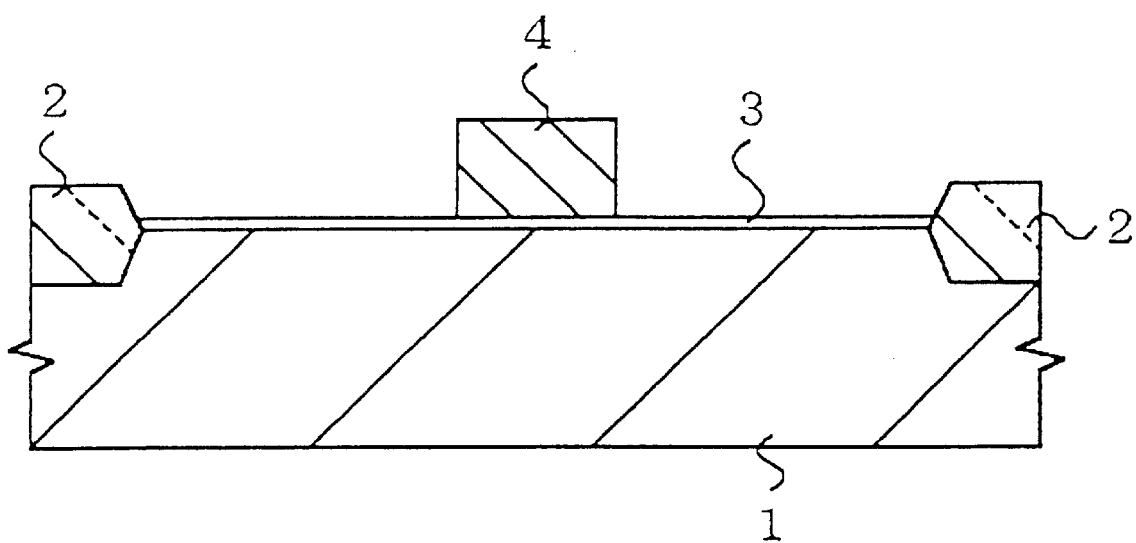
FIGS. 9A through 9F are fragmentary cross sectional elevation views illustrative of novel MOS field effect transistors in sequential steps involved in a novel fabrication method in a third embodiment in accordance with the present invention.

With reference to FIG. 9A, a p-type silicon substrate 1 is used. Field oxide films 2 are selectively formed on a surface of the p-type silicon substrate 1 to define an active region on which a MOS field effect transistor will be formed. A gate oxide film 3 having a thickness of about 6 manometers is formed on an active region of the p-type silicon substrate 1. A phosphorus-doped polysilicon layer having a thickness of about 300 manometers is entirely formed which extends over the field oxide films 2 and the gate oxide film 3. The polysilicon layer is then subjected to a dry etching to selectively remove the polysilicon layer, whereby a polysilicon gate electrode 4 is formed on the gate oxide film 3.

Figure 9B:
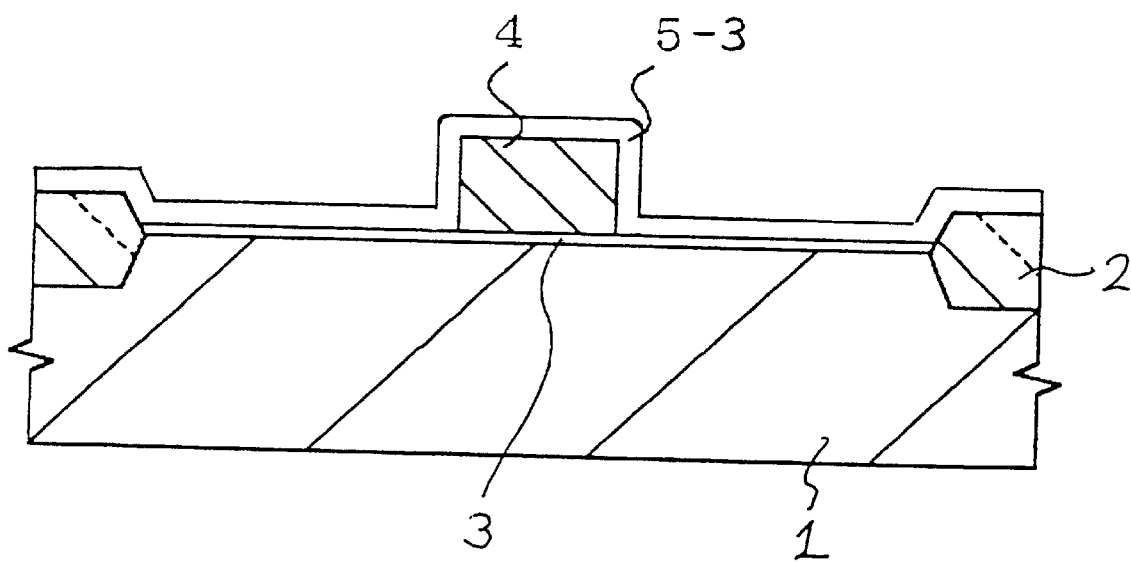

With reference to FIG. 9B, a chemical vapor deposition is carried out to entirely deposit a silicon nitride film 5-3 whereby a CVD nitride film 5-3 is formed which extends over a top surface of the polysilicon gate electrode 4 and extends on side walls of the polysilicon gate electrode 4 as well as extends over the gate oxide films 3 and the field oxide films 2. The CVD nitride film 5-3 has a thickness of about 5 nanometers.

Figure 9C:
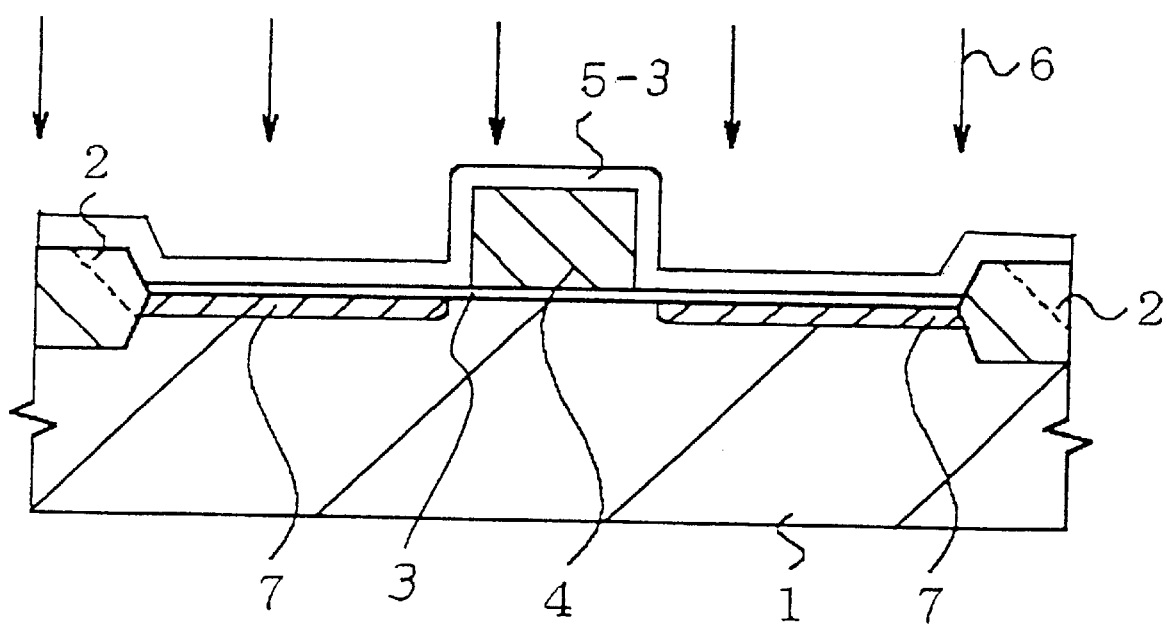

With reference to FIG. 9C, not only the field oxide films 2 and the polysilicon gate electrode 4 but also vertically extending parts of the CVD nitride film 5-3 on the side walls of the gate electrode 4 are used as masks for ion-implantation of an n-type impurity 6 into the surface region of the p-type silicon substrate 1 and subsequent heat treatment to the p-type silicon substrate 1 for causing a thermal diffusion of ion-implanted n-type impurity, whereby shallow lightly-doped diffusion regions 7 are formed in upper regions of the p-type silicon substrate 1 except not only under the field oxide films 2 and the gate electrode 4 but also under the vertically extending parts of the CVD nitride film 5-3 on the side walls of the gate electrode 4. As a result, inside edges of the lightly doped diffusion layers 7 are positioned under outside edges of the CVD oxide films 5-2.

There is no overlap between the lightly doped diffusion layers 7 and the polysilicon gate electrode 4.

Figure 9D:
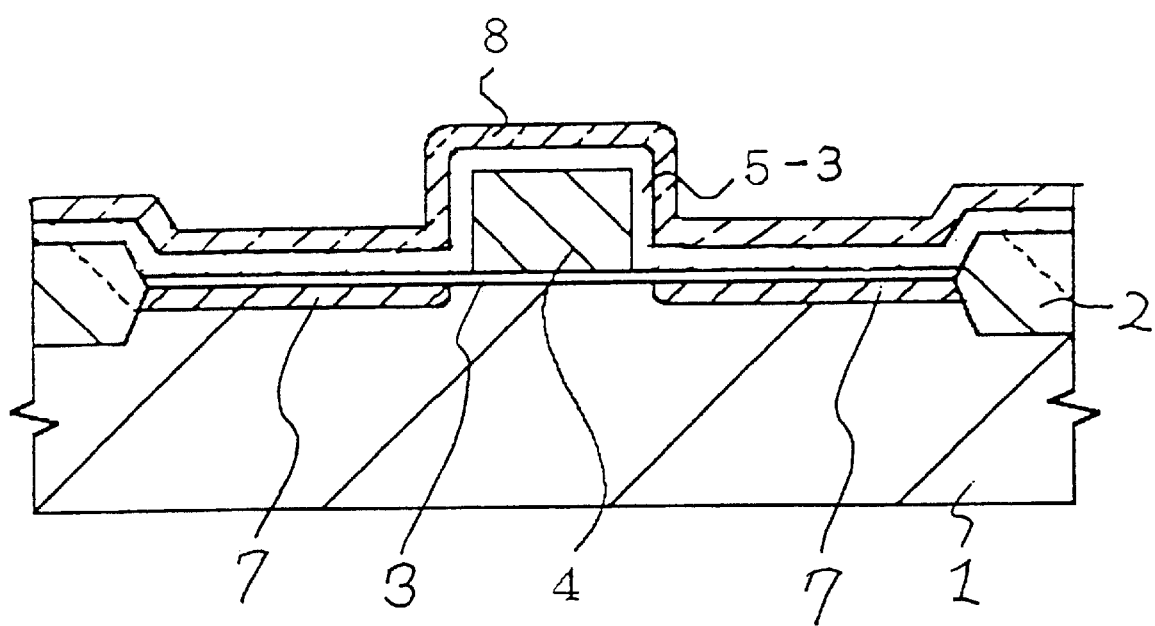

With reference to FIG. 9D, a chemical vapor deposition is carried out to entirely deposit a CVD silicon oxide film 8 having a thickness of about 100 nanometers so that the silicon oxide film 8 covers the field oxide films 2 and the CVD nitride film 5-3.

Figure 9E:
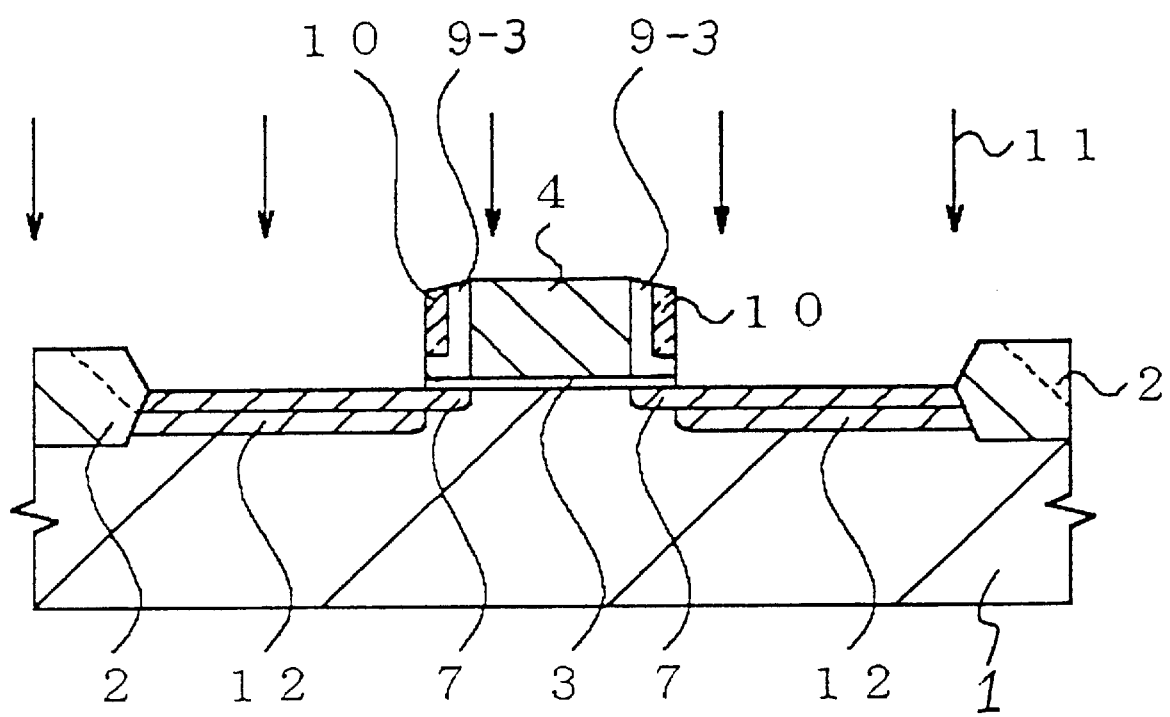

With reference to FIG. 9E, a reactive ion etching is carried out to the CVD silicon oxide film 8 and the CVD nitride film 5-3 so that the CVD silicon oxide film 8 and the CVD nitride film 5-3 are subjected to an etch-back whereby laminations of the CVD silicon oxide film 8 and the CVD nitride film 5-3 remain only on the side walls of the polysilicon gate electrode 4. As a result, the laminations of the CVD silicon oxide film 8 and the CVD nitride film 5-3 are made into laminations of a CVD silicon oxide side wall insulation film 10 and a CVD nitride side wall spacer layer 9-3 which are provided on the side walls of the polysilicon gate electrode 4. An ion-implantation of an n-type impurity 11 into the silicon substrate 1 is carried out by use of the CVD silicon oxide side wall insulation film 10 and the CVD nitride side wall spacer layers 9-3 as masks for subsequent heat treatment thereby to form source/drain diffusion layers 12. As a result, the source/drain diffusion layers 12 have inside edges which are positioned under the outside edges of the CVD silicon oxide side wall insulation films 10. Namely, the boundaries between the source/drain diffusion layers 12 and the lightly doped diffusion layers 7 are positioned under the outside edges of the CVD silicon oxide side wall insulation films 10. The above heat treatment causes further diffusions of the lightly doped diffusion layers 7 inwardly so that the inside edges of the lightly-doped diffusion layers are diffused to positions under the CVD nitride side wall spacer layers 9-3. As a result, the inside edges of the lightly-doped diffusion layers 7 are positioned inside of the CVD silicon oxide side wall insulation films 10 and outside of the gate electrode 4.

Figure 9F:
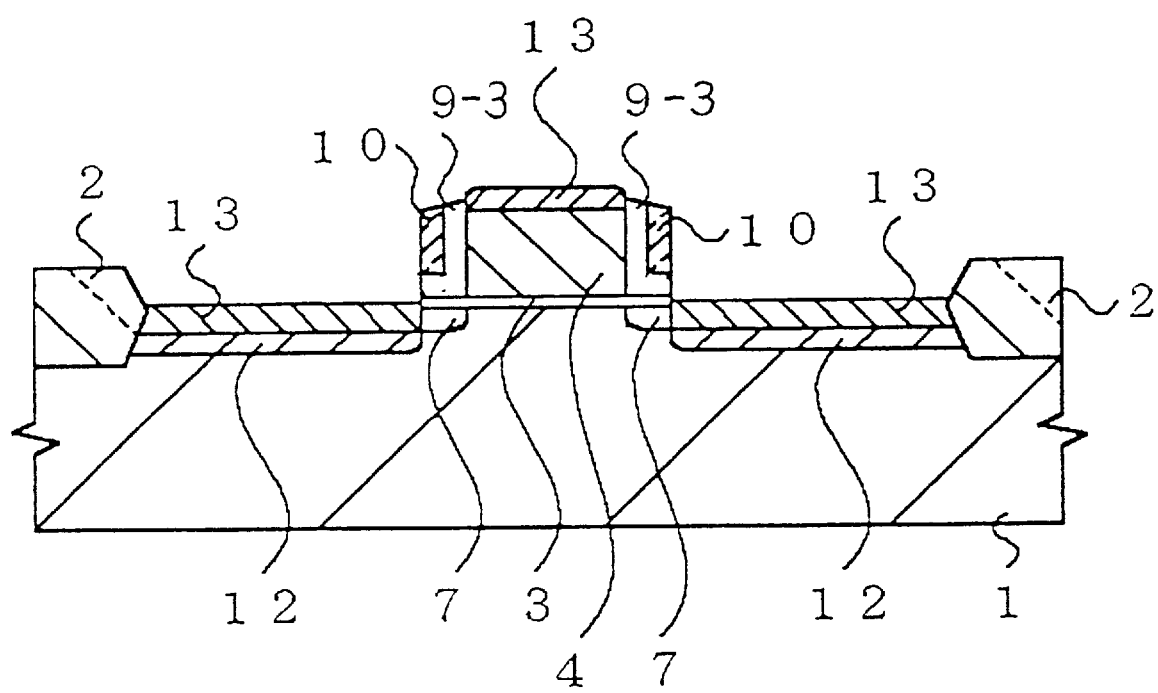

With reference to FIG. 9F, a titanium film having a thickness of about 30 nanometers is entirely deposited which extends on the field oxide films 2 and over the source/drain diffusion layers 12 as well as on the CVD silicon oxide side wall insulation films 10 and over the CVD nitride side wall spacer layers 9-3 and a top surface of the polysilicon gate electrode 4. A heat treatment to the silicon substrate 1 in an inert gas such as a nitrogen gas to cause a selective silicidation reaction between silicon and titanium atoms whereby titanium silicide layers 13 are selectively formed on the top surface of the polysilicon gate electrode 4 and on the source/drain diffusion layers 12, whilst no silicidation reaction is caused over the field oxide films 2 and on the CVD silicon oxide side wall insulation films 10 and the CVD nitride side wall spacer layers 9-3. The unreacted titanium film is removed.

The source/drain diffusion layers 12 have the refractory metal silicide layers 13 and the lightly-doped diffusion layers 7. The polysilicon gate electrode 4 also has the refractory metal silicide layers 13.

The above novel lightly-doped diffusion layer structure provides no overlap of the lightly-doped diffusion layer 7 and the gate electrode 4. Namely, the lightly-doped diffusion layers 7 are formed by ion-implantation of the impurity by use of the gate electrode 4 and the CVD nitride side wall spacer layers 9-3 as the masks whereby the inside edges of the lightly doped diffusion layers 7 are positioned under the outside edges of the CVD nitride side wall spacer layers 9-3. Thereafter, to form the source and drain diffusion layers 12, a heat treatment is caused. This heat treatment causes further diffusions inwardly of the lightly doped diffusion layers 7, whereby the inside edges of the lightly doped diffusion layers 7 are moved into inside of the CVD silicon oxide side wall insulation films 10 but outside of the outside edge of the gate electrode 4. As a result, the inside edges of the lightly doped diffusion layers 7 are positioned under the CVD nitride side wall spacer layers 9-3, for which reason there is formed no overlap between the lightly doped diffusion layers 7 and the gate electrode 4. Even if the 0.25 micrometers scale rule is applied to design of the MOS field effect transistor, no overlap between the lightly doped diffusion layers 7 and the gate electrode 4 is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers 7 and the gate electrode 4 results in a remarkable improvement in resistivity to hot-electron.

Fourth Embodiment

Figure 10:
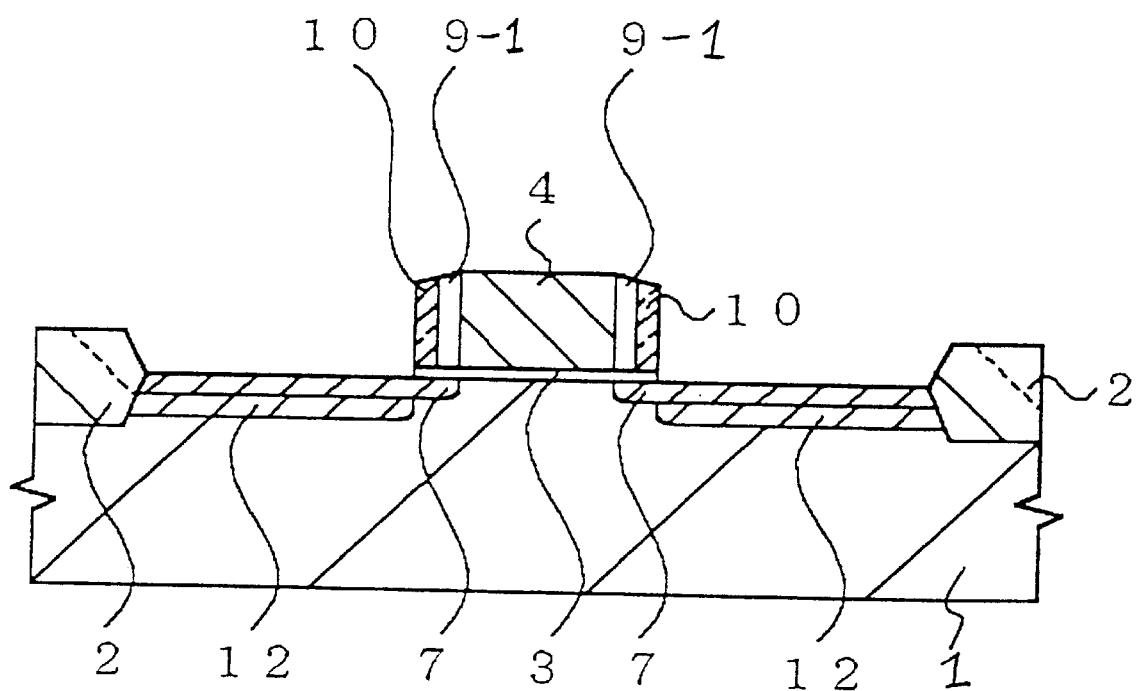
FIG. 10 is a fragmentary cross sectional elevation view illustrative of a novel MOS field effect transistor with an improved lightly-doped diffusion layer structure in a fourth embodiment in accordance with the present invention.

A fourth embodiment according to the present invention will be described in detail with reference to FIG. 10 which is a fragmentary cross sectional elevation view illustrative of a novel MOS field effect transistor with an improved lightly-doped diffusion layer structure.

A structure of a novel MOS field effect transistor will be described as follows. Field oxide films 2 are selectively provided on a top surface of a p-type silicon substrate 1 to define an active region of the silicon substrate 1. A gate oxide film 3 is formed on the active region of the silicon substrate 1. A polysilicon gate electrode 4 is selectively provided on the gate oxide film 3. Side wall spacer layers 9-1 of thermal oxide films are selectively provided on side walls of the polysilicon gate electrode 4 and over the gate oxide film 3. Further, CVD silicon oxide side wall insulation films 10 are also selectively provided on the thermal oxide side wall spacer layers 9-1 and over the gate oxide film 3 so as to form laminations of the thermal oxide side wall spacer layers 9-1 and the CVD silicon oxide side wall insulation films 10. Source and drain diffusion layers 12 are selectively provided in upper regions of the silicon substrate 1. Lightly-doped diffusion layers 7 are further provided which extend from the inside edges of the source and drain diffusion layers 12 through the upper regions of the silicon substrate 1 so that the lightly-doped diffusion layers 7 are positioned under the laminations of the thermal oxide side wall spacer layers 9-1 and the CVD silicon oxide side wall insulation films 10. The inside edges of the lightly-doped diffusion layers 7 are positioned inside of the CVD silicon oxide side wall insulation films 10 and outside of the polysilicon gate electrode. Namely, the inside edges of the lightly-doped diffusion layers 7 are positioned under the inside edges of the lightly-doped diffusion layers 7. The thermal oxide side wall spacer layers 9-1 may have a thickness in the range of 5–10 nanometers.

Subsequently, a novel fabrication method of the above improved MOS field effect transistor will be described with reference to FIGS. 11A through 11E which are fragmentary cross sectional elevation views illustrative of novel MOS field effect transistors in sequential steps involved in a novel fabrication method.

Figure 11A:
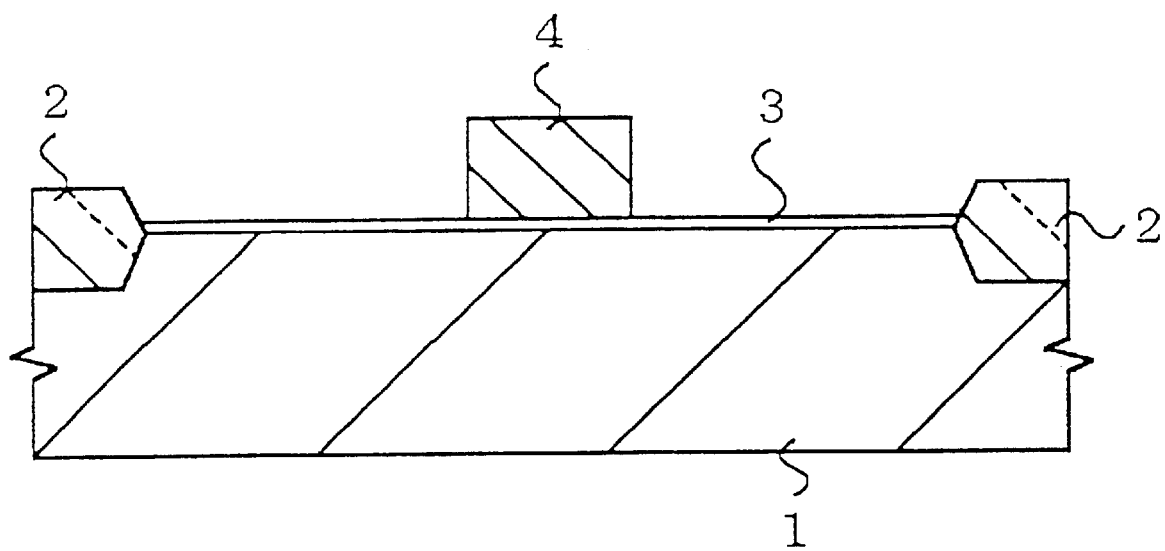
FIGS. 11A through 11E are fragmentary cross sectional elevation views illustrative of novel MOS field effect transistors in sequential steps involved in a novel fabrication method in a fourth embodiment in accordance with the present invention.

With reference to FIG. 11A, a p-type silicon substrate 1 is used. Field oxide films 2 are selectively formed on a surface of the p-type silicon substrate 1 to define an active region on which a MOS field effect transistor will be formed. A gate oxide film 3 having a thickness of about 6 manometers is formed on an active region of the p-type silicon substrate 1.

A phosphorus-doped polysilicon layer having a thickness of about 300 manometers is entirely formed which extends over the field oxide films 2 and the gate oxide film 3. The polysilicon layer is then subjected to a dry etching to selectively remove the polysilicon layer, whereby a polysilicon gate electrode 4 is formed on the gate oxide film 3.

Figure 11B:
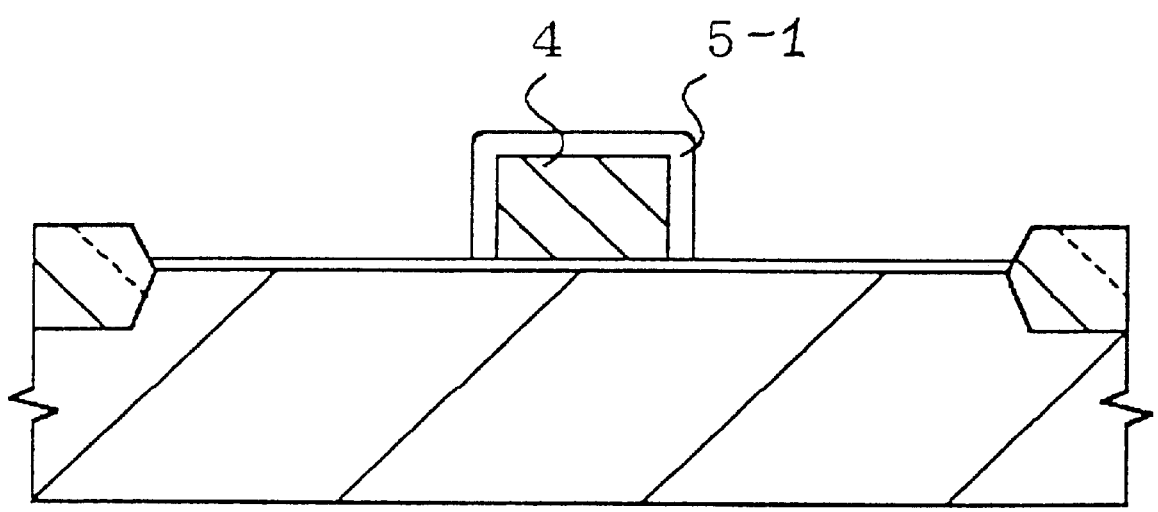

With reference to FIG. 11B, the polysilicon gate electrode 4 is subjected to a thermal oxidation process whereby a thermal oxide film 5-1 is formed which extends over a top surface of the polysilicon gate electrode 4 and extends on side walls of the polysilicon gate electrode 4. The thermal oxide film 5-1 has a thickness of about 5 nanometers. The thermal oxidation process is carried out at a temperature of 850° C. in an oxygen gas.

In this thermal oxidation process, any residual polysilicon particularly on steps between the gate oxide film 3 and the field oxide films 2 after the dry etching process are made into silicon oxide.

Figure 11C:
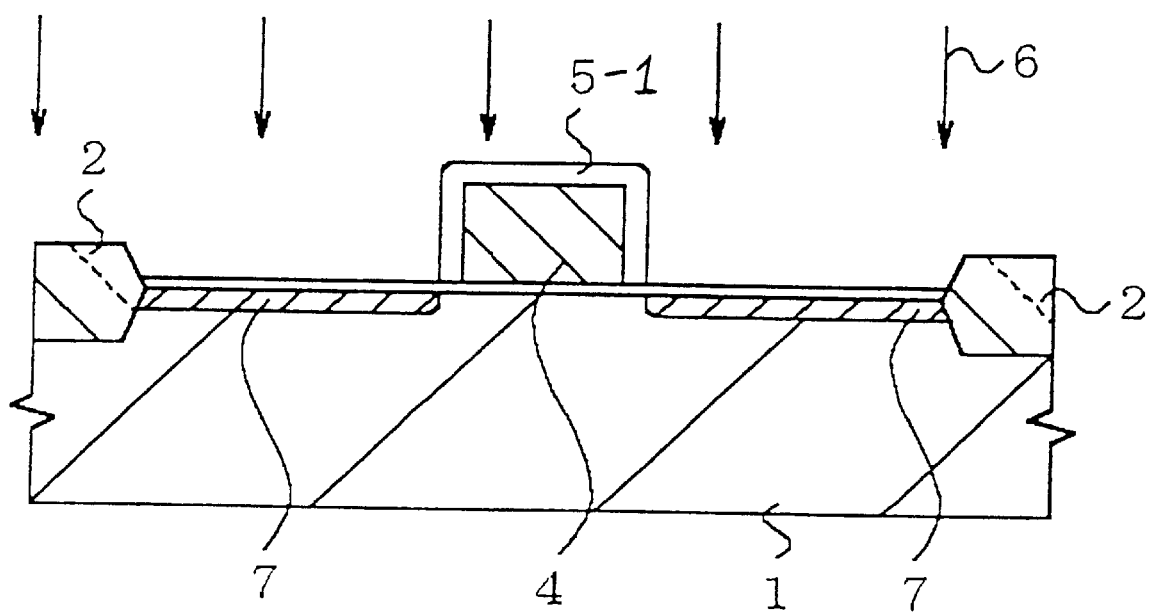

With reference to FIG. 11C, not only the field oxide films 2 and the polysilicon gate electrode 4 but also the thermal oxide film 5-1 are used as masks for ion-implantation of an n-type impurity 6 into the surface region of the p-type silicon substrate 1 and subsequent heat treatment to the p-type silicon substrate 1 for causing a thermal diffusion of ion-implanted n-type impurity, whereby shallow lightly-doped diffusion regions 7 are formed in upper regions of the p-type silicon substrate 1 except not only under the field oxide films 2 and the gate electrode 4 but also under the thermal oxide film 5-1. As a result, inside edges of the lightly doped diffusion layers 7 are positioned under outside edges of the thermal oxide film 5-1. There is no overlap between the lightly doped diffusion layers 7 and the polysilicon gate electrode 4.

Figure 11D:
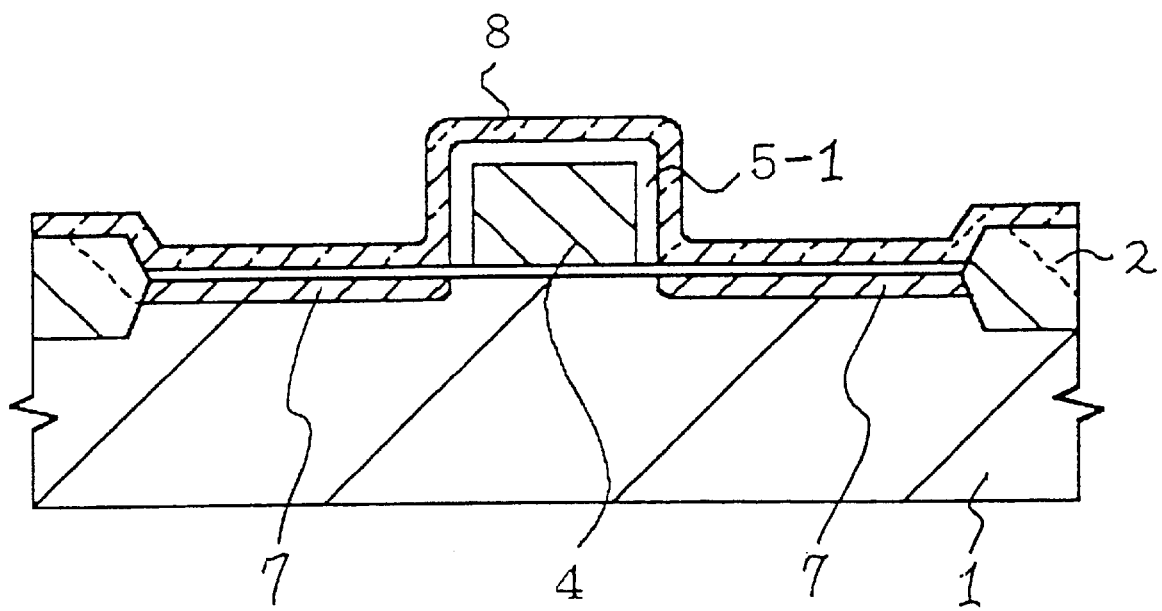

With reference to FIG. 11D, a chemical vapor deposition is carried out to entirely deposit a CVD silicon oxide film 8 having a thickness of about 100 nanometers so that the silicon oxide film 8 covers the field oxide films 2 and the gate oxide film 3 over the lightly doped diffusion regions 7 as well as side walls and a top surface of the thermal oxide film 5-1. The chemical vapor deposition is carried out by use of a tetra-ethyl-ortho-silicate gas (TEOS gas) as an organic silane source gas. If the chemical vapor deposition is carried out using the organic silane gas, the quality of the CVD silicon oxide film 8 deposited by the chemical vapor deposition is likely to depend largely upon the base layer. In this case, however, the base layer comprises the thermal silicon oxide film 5-1. This ensues a high quality of the CVD silicon oxide film 8.

Figure 11E:
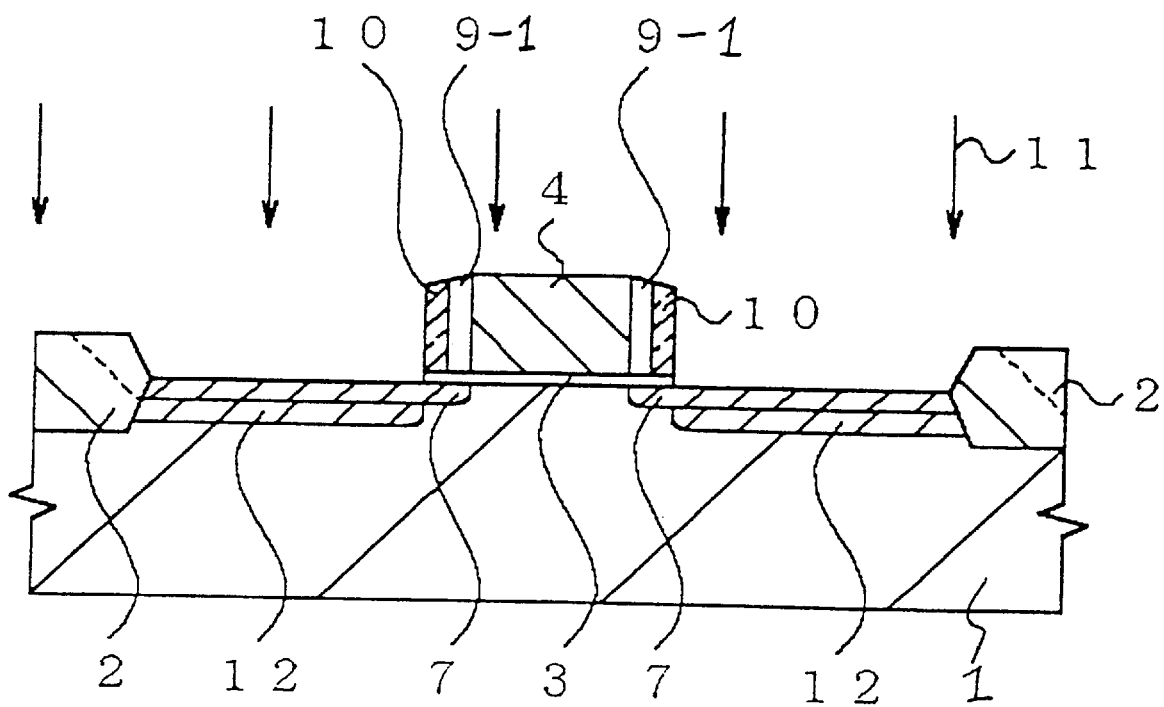

With reference to FIG. 11E, a reactive ion etching is carried out to the CVD silicon oxide film 8 and the thermal oxide film 5-1 so that the CVD silicon oxide film 8 and the thermal oxide film 5-1 are subjected to an etch-back whereby laminations of the CVD silicon oxide film 8 and the thermal oxide film 5-1 remain only on the side walls of the polysilicon gate electrode 4. As a result, the laminations of the CVD silicon oxide film 8 and the thermal oxide film 5-1 are made into laminations of a CVD silicon oxide side wall insulation film 10 and a thermal oxide side wall spacer layers 9-1 which are provided on the side walls of the polysilicon gate electrode 4. An ion-implantation of an n-type impurity 11 into the silicon substrate 1 is carried out by use of the CVD silicon oxide side wall insulation film 10 and the thermal oxide side wall spacer layers 9-1 as masks for subsequent heat treatment thereby to form source/drain diffusion layers 12. As a result, the source/drain diffusion layers 12 have inside edges which are positioned under the outside edges of the CVD silicon oxide side wall insulation films 10. Namely, the boundaries between the source/drain diffusion layers 12 and the lightly doped diffusion layers 7 are positioned under the outside edges of the CVD silicon oxide side wall insulation films 10. The above heat treatment causes further diffusions of the lightly doped diffusion layers 7 inwardly so that the inside edges of the lightly-doped diffusion layers are diffused to positions under the thermal oxide side wall spacer layers 9-1. As a result, the inside edges of the lightly-doped diffusion layers 7 are positioned inside of the CVD silicon oxide side wall insulation films 10 and outside of the gate electrode 4.

The above novel lightly-doped diffusion layer structure provides no overlap of the lightly-doped diffusion layer 7 and the gate electrode 4. Namely, the lightly-doped diffusion layers 7 are formed by ion-implantation of the impurity by use of the gate electrode 4 and the thermal oxide side wall spacer layers 9-1 as the masks whereby the inside edges of the lightly doped diffusion layers 7 are positioned under the outside edges of the thermal oxide side wall spacer layers 9-1. Thereafter, to form the source and drain diffusion layers 12, a heat treatment is caused. This heat treatment causes further diffusions inwardly of the lightly doped diffusion layers 7, whereby the inside edges of the lightly doped diffusion layers 7 are moved into inside of the CVD silicon oxide side wall insulation films 10 but outside of the outside edge of the gate electrode 4. As a result, the inside edges of the lightly doped diffusion layers 7 are positioned under the thermal oxide side wall spacer layers 9-1, for which reason there is formed no overlap between the lightly doped diffusion layers 7 and the gate electrode 4. Even if the 0.25 micrometers scale rule is applied to design of the MOS field effect transistor, no overlap between the lightly doped diffusion layers 7 and the gate electrode 4 is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers 7 and the gate electrode 4 results in a remarkable improvement in resistivity to hot-electron. In the light of a life-time defined by a 10% reduction of a mutual conductance of the MOS field effect transistor, the above novel MOS field effect transistor has a life-time which is longer by one-order than that of the conventional MOS field effect transistor.

Since the CVD silicon oxide side wall insulation films 10 and the thermal oxide side wall spacer layers 9-1 are made of silicon oxide, this makes it easy to do an accurate control of etch-back to form the CVD silicon oxide side wall insulation films 10 and the thermal oxide side wall spacer layers 9-1. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode 4 and the source/drain diffusion layers 12.

The above thermal oxide side wall spacer layers 9-1 is formed by the thermal oxidation of the polysilicon gate electrode 4. This thermal oxidation process makes any residual polysilicon into silicon oxide which is electrically insulative. There is no drop of an insulating resistance between the adjacent two polysilicon gate electrodes 4. The polysilicon gate electrodes 4 are defined by a dry etching to a polysilicon layer extending over the gate insulation film 3 and also over the field oxide films 2. There are steps with a difference in level at boundaries between the gate insulation film 3 and the field oxide films 2. In the dry etching process, the polysilicon layer is likely to reside on the steps between the gate insulation film 3 and the field oxide films 2. The residual polysilicon films on the steps between the polysilicon gate insulation film 3 and the field oxide films 2 are, however, made into the silicon oxide film by the thermal oxidation process. The silicon oxide film prevents any leakage of current between the adjacent two polysilicon gate electrodes 4. No leakage of current between the adjacent two polysilicon gate electrodes 4 appears even if the MOS field effect transistors are scaled down and the density of integration of the MOS field effect transistors is increased.

Fifth Embodiment

Figure 12:
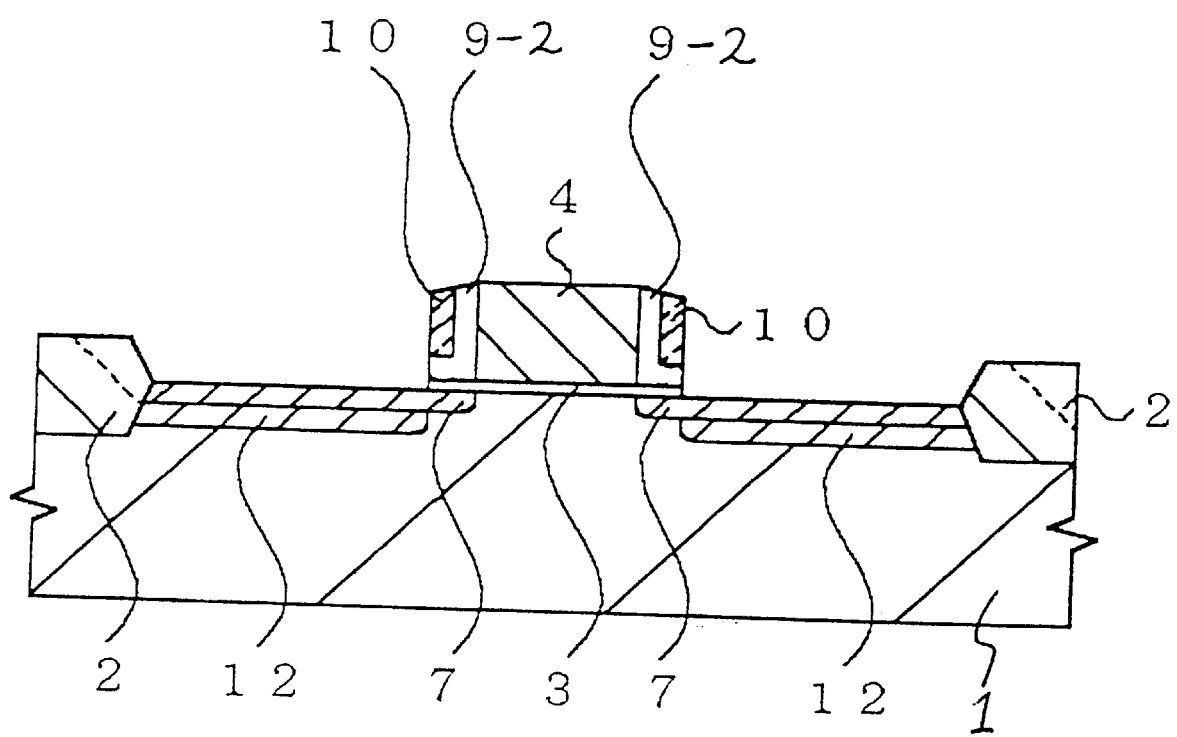
FIG. 12 is a fragmentary cross sectional elevation view illustrative of a novel MOS field effect transistor with an improved lightly-doped diffusion layer structure in a fifth embodiment in accordance with the present invention.

A fifth embodiment according to the present invention will be described in detail with reference to FIG. 12 which is a fragmentary cross sectional elevation view illustrative of a novel MOS field effect transistor with an improved lightly-doped diffusion layer structure.

A structure of a novel MOS field effect transistor will be described as follows. Field oxide films 2 are selectively provided on a top surface of a p-type silicon substrate 1 to define an active region of the silicon substrate 1. A gate oxide film 3 is formed on the active region of the silicon substrate 1. A polysilicon gate electrode 4 is selectively provided on the gate oxide film 3. Side wall spacer layers 9-2 of thermal oxide films are selectively provided on side walls of the polysilicon gate electrode 4 and over the gate oxide film 3. Further, CVD silicon oxide side wall insulation films 10 are also selectively provided on the CVD oxide side wall spacer layers 9-2 and over the gate oxide film 3 so as to form laminations of the CVD oxide side wall spacer layers 9-2 and the CVD silicon oxide side wall insulation films 10. Source and drain diffusion layers 12 are selectively provided in upper regions of the silicon substrate 1. Lightly-doped diffusion layers 7 are further provided which extend from the inside edges of the source and drain diffusion layers 12 through the upper regions of the silicon substrate 1 so that the lightly-doped diffusion layers 7 are positioned under the laminations of the CVD oxide side wall spacer layers 9-2 and the CVD silicon oxide side wall insulation films 10. The inside edges of the lightly-doped diffusion layers 7 are positioned inside of the CVD silicon oxide side wall insulation films 10 and outside of the polysilicon gate electrode. Namely, the inside edges of the lightly-doped diffusion layers 7 are positioned under the inside edges of the lightly-doped diffusion layers 7. The CVD oxide side wall spacer layers 9-2 may have a thickness in the range of 5–10 nanometers.

Subsequently, a novel fabrication method of the above improved MOS field effect transistor will be described with reference to FIGS. 13A through 13E which are fragmentary cross sectional elevation views illustrative of novel MOS field effect transistors in sequential steps involved in a novel fabrication method.

Figure 13A:
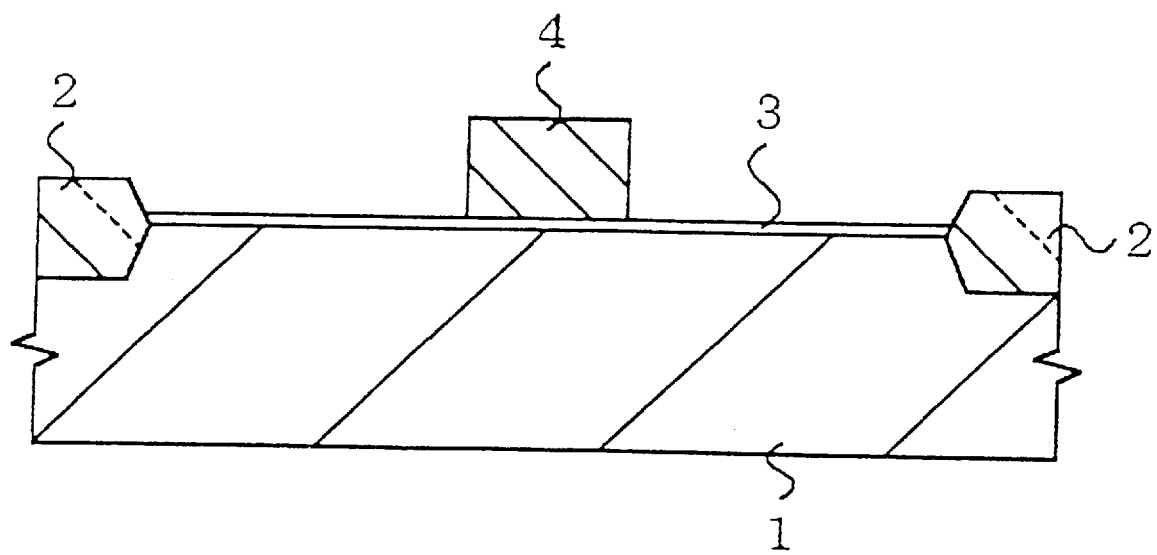
FIGS. 13A through 13E are fragmentary cross sectional elevation views illustrative of novel MOS field effect transistors in sequential steps involved in a novel fabrication method in a fifth embodiment in accordance with the present invention.

With reference to FIG. 13A, a p-type silicon substrate 1 is used. Field oxide films 2 are selectively formed on a surface of the p-type silicon substrate 1 to define an active region on which a MOS field effect transistor will be formed. A gate oxide film 3 having a thickness of about 6 manometers is formed on an active region of the p-type silicon substrate 1. A phosphorus-doped polysilicon layer having a thickness of about 300 manometers is entirely formed which extends over the field oxide films 2 and the gate oxide film 3. The polysilicon layer is then subjected to a dry etching to selectively remove the polysilicon layer, whereby a polysilicon gate electrode 4 is formed on the gate oxide film 3.

Figure 13B:
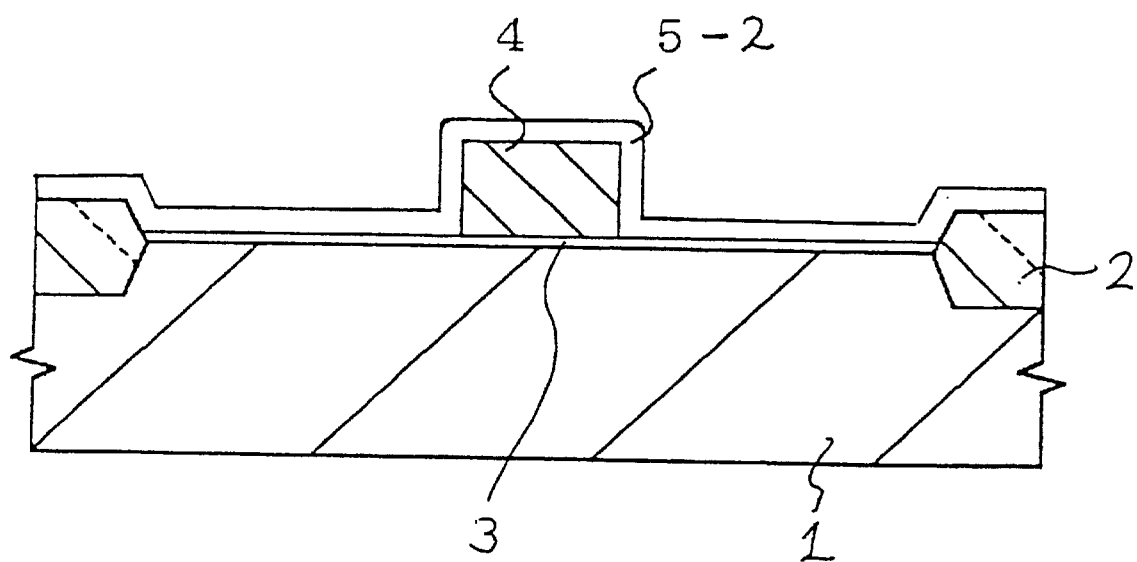

With reference to FIG. 13B, a chemical vapor deposition is carried out to entirely deposit a silicon oxide film 5-2 whereby a CVD oxide film 5-2 is formed which extends over a top surface of the polysilicon gate electrode 4 and extends on side walls of the polysilicon gate electrode 4 as well as extends over the gate oxide films 3 and the field oxide films 2. The CVD oxide film 5-2 has a thickness of about 5 nanometers.

Figure 13C:
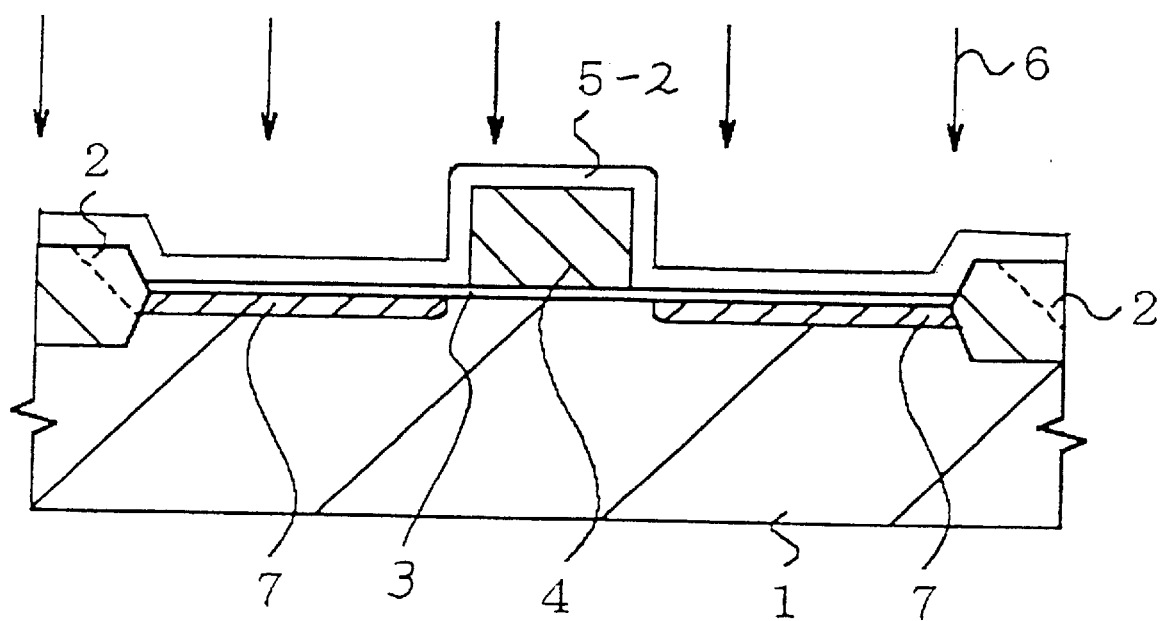

With reference to FIG. 13C, not only the field oxide films 2 and the polysilicon gate electrode 4 but also vertically extending parts of the CVD oxide film 5-2 on the side walls of the gate electrode 4 are used as masks for ion-implantation of an n-type impurity 6 into the surface region of the p-type silicon substrate 1 and subsequent heat treatment to the p-type silicon substrate 1 for causing a thermal diffusion of ion-implanted n-type impurity, whereby shallow lightly-doped diffusion regions 7 are formed in upper regions of the p-type silicon substrate 1 except not only under the field oxide films 2 and the gate electrode 4 but also under the vertically extending parts of the CVD oxide film 5-2 on the side walls of the gate electrode 4. As a result, inside edges of the lightly doped diffusion layers 7 are positioned under outside edges of the CVD oxide films 5-2. There is no overlap between the lightly doped diffusion layers 7 and the polysilicon gate electrode 4.

Figure 13D:
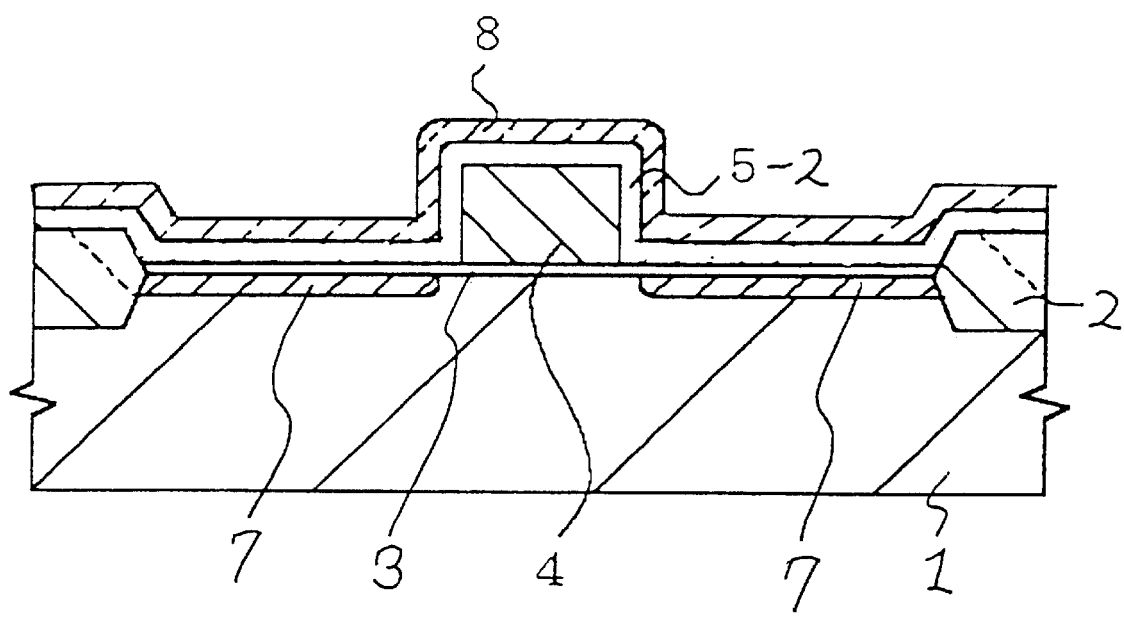

With reference to FIG. 13D, a chemical vapor deposition is carried out to entirely deposit a CVD silicon oxide film 8 having a thickness of about 100 nanometers so that the silicon oxide film 8 covers the field oxide films 2 and the CVD oxide film 5-2. The chemical vapor deposition is carried out by use of a tetra-ethyl-ortho-silicate gas (TEOS gas) as an organic silane source gas. If the chemical vapor deposition is carried out using the organic silane gas, the quality of the CVD silicon oxide film 8 deposited by the chemical vapor deposition is likely to depend largely upon the base layer. In this case, however, the base layer comprises the CVD oxide film 5-2. This ensues a high quality of the CVD silicon oxide film 8.

Figure 13E:
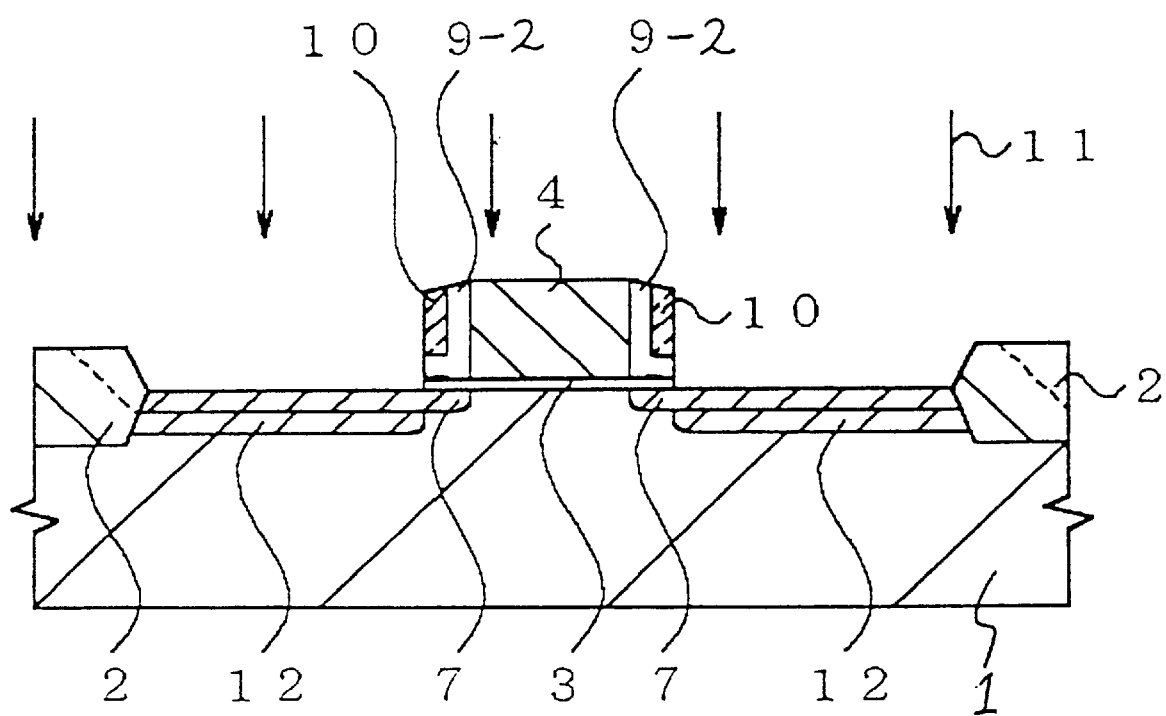

With reference to FIG. 13E, a reactive ion etching is carried out to the CVD silicon oxide film 8 and the CVD oxide film 5-2 so that the CVD silicon oxide film 8 and the CVD oxide film 5-2 are subjected to an etch-back whereby laminations of the CVD silicon oxide film 8 and the CVD oxide film 5-2 remain only on the side walls of the polysilicon gate electrode 4. As a result, the laminations of the CVD silicon oxide film 8 and the CVD oxide film 5-2 are made into laminations of a CVD silicon oxide side wall insulation film 10 and a CVD oxide side wall spacer layer 9-2 which are provided on the side walls of the polysilicon gate electrode 4. An ion-implantation of an n-type impurity 11 into the silicon substrate 1 is carried out by use of the CVD silicon oxide side wall insulation film 10 and the CVD oxide side wall spacer layers 9-2 as masks for subsequent heat treatment thereby to form source/drain diffusion layers 12. As a result, the source/drain diffusion layers 12 have inside edges which are positioned under the outside edges of the CVD silicon oxide side wall insulation films 10. Namely, the boundaries between the source/drain diffusion layers 12 and the lightly doped diffusion layers 7 are positioned under the outside edges of the CVD silicon oxide side wall insulation films 10. The above heat treatment causes further diffusions of the lightly doped diffusion layers 7 inwardly so that the inside edges of the lightly-doped diffusion layers are diffused to positions under the CVD oxide side wall spacer layers 9-2. As a result, the inside edges of the lightly-doped diffusion layers 7 are positioned inside of the CVD silicon oxide side wall insulation films 10 and outside of the gate electrode 4.

The above novel lightly-doped diffusion layer structure provides no overlap of the lightly-doped diffusion layer 7 and the gate electrode 4. Namely, the lightly-doped diffusion layers 7 are formed by ion-implantation of the impurity by use of the gate electrode 4 and the CVD oxide side wall spacer layers 9-2 as the masks whereby the inside edges of the lightly doped diffusion layers 7 are positioned under the outside edges of the CVD oxide side wall spacer layers 9-2. Thereafter, to form the source and drain diffusion layers 12, a heat treatment is caused. This heat treatment causes further diffusions inwardly of the lightly doped diffusion layers 7, whereby the inside edges of the lightly doped diffusion layers 7 are moved into inside of the CVD silicon oxide side wall insulation films 10 but outside of the outside edge of the gate electrode 4. As a result, the inside edges of the lightly doped diffusion layers 7 are positioned under the CVD oxide side wall spacer layers 9-2, for which reason there is formed no overlap between the lightly doped diffusion layers 7 and the gate electrode 4. Even if the 0.25 micrometers scale rule is applied to design of the MOS field effect transistor, no overlap between the lightly doped diffusion layers 7 and the gate electrode 4 is formed. This further makes it easy to do an accurate control of a channel length of the MOS field effect transistor.

The above novel lightly-doped diffusion layer structure provides a remarkable improvement in resistivity to hot-electron. Namely, no overlap between the lightly doped diffusion layers 7 and the gate electrode 4 results in a remarkable improvement in resistivity to hot-electron.

Since the CVD silicon oxide side wall insulation films 10 and the CVD oxide side wall spacer layers 9-2 are made of silicon oxide, this makes it easy to do an accurate control of etch-back to form the CVD silicon oxide side wall insulation films 10 and the CVD oxide side wall spacer layers 9-2. Namely, the above novel MOS field effect transistor has a multi-layered or double-layered but single-material side wall structure. The multi-layered or double-layered but single-material side wall insulator structure makes it easy to do a precise control of the etch-back due to the same materials of the double layers.

Further, the silicon oxide side wall insulator and the silicon oxide side wall spacer layer without use of silicon nitride having a high dielectric constant result in no remarkable increase in parasitic capacitance between the gate electrode 4 and the source/drain diffusion layers 12.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A MOS field effect transistor comprising:
   a silicon substrate;
   source/drain diffusion layers having upper regions which comprise metal silicide layers and said source/drain diffusion layers being selectively provided in upper regions of said silicon substrate;
   lightly-doped diffusion layers having a lower planar surface coplanar with a lower planar surface of said metal silicide layers extending from inside edges of said source/drain diffusion layers toward a channel region of said silicon substrate;

a gate insulation film being provided on said channel region of said silicon substrate;

a gate electrode being provided on said gate insulation film;

side wall insulation films being provided on side walls of said gate electrode so that outside edges of said side wall insulation films are positioned over boundaries between said source/drain diffusion layers and said lightly-doped diffusion layers, wherein side wall spacer layers are further provided on interfaces between said side walls of said gate electrode and said side wall insulation films, and inside edges of said lightly-doped diffusion layers are positioned under said side wall spacer layers so that each of said inside edges of said lightly-doped diffusion layers is positioned inside of said side wall insulation films and outside of said gate electrode.

2. The MOS field effect transistor as claimed in claim 1, wherein said inside edge of said lightly-doped diffusion layer is positioned intermediate an interface between said side wall spacer layer and said side wall insulation film and an interface between said gate electrode and said side wall spacer layer.

3. The MOS field effect transistor as claimed in claim 1, wherein said inside edge of said lightly-doped diffusion layer is positioned under an intermediate position in a thickness direction of said side wall spacer layer.

4. The MOS field effect transistor as claimed in claim 1, wherein said side wall spacer layer has a thickness in the range of 5–10 nanometers.

5. The side wall structure as claimed in claim 1, wherein said side wall spacer layer is made of silicon oxide.

6. The MOS field effect transistor as claimed in claim 1, wherein said side wall spacer layer is made of silicon nitride.

7. The MOS field effect transistor as claimed in claim 1, wherein said gate electrode comprises a polysilicon layer on which a metal silicide layer is formed.

8. The MOS field effect transistor as claimed in claim 1, wherein said side wall insulation film is made of one selected from the group consisting of silicon oxide and silicon nitride.

9. The MOS field effect transistor as claimed in claim 1, wherein laminations of said side wall spacer layers and said side wall insulation films extend over parts of the gate insulation film which are positioned over said lightly-doped diffusion layers, wherein said side wall insulation films are contact-free of said gate insulation film.

* * * * *